United States Patent
Hollmer et al.

(10) Patent No.: US 8,947,907 B1
(45) Date of Patent: Feb. 3, 2015

(54) CURRENT SOURCE CIRCUITS AND METHODS FOR MASS WRITE AND TESTING OF PROGRAMMABLE IMPEDANCE ELEMENTS

(71) Applicant: Adesto Technologies Corporation, Sunnyvale, CA (US)

(72) Inventors: Shane Charles Hollmer, Grass Valley, CA (US); John Dinh, Dublin, CA (US)

(73) Assignee: Adesto Technologies Corporation, Sunnyvale, CA (US)

(*) Notice: Subject to any disclaimer, the term of this patent is extended or adjusted under 35 U.S.C. 154(b) by 0 days.

(21) Appl. No.: 13/862,390

(22) Filed: Apr. 13, 2013

Related U.S. Application Data

(63) Continuation of application No. 12/980,752, filed on Dec. 29, 2010, now Pat. No. 8,437,171.

(60) Provisional application No. 61/291,744, filed on Dec. 31, 2009.

(51) Int. Cl.
*G11C 11/00* (2006.01)
*G11C 7/00* (2006.01)

(52) U.S. Cl.
CPC ...................................... *G11C 7/00* (2013.01)
USPC ........... 365/148; 365/158; 365/171; 365/173; 365/185.11; 365/189.011

(58) Field of Classification Search
CPC ........... G11C 13/0002; G11C 13/0011; G11C 16/0483; G11C 16/10; G11C 2013/0073
USPC .............. 365/158, 171, 173, 185.11, 189.011
See application file for complete search history.

(56) References Cited

U.S. PATENT DOCUMENTS

2008/0002481 A1* 1/2008 Gogl et al. ............... 365/189.06

OTHER PUBLICATIONS

U.S. Appl. No. 12/980,752 dated Dec. 29, 2010, parent of the present application.

* cited by examiner

*Primary Examiner* — Thong Q Le

(57) ABSTRACT

An integrated circuit device can include a plurality of memory cells, each including at least one element programmable between different impedance states by application of a voltage or current; a plurality of bit line groups, each bit line group including multiple bit lines, each bit line being coupled to multiple memory cells; a plurality of current source circuits coupled to the bit line groups, each current source circuit configured to couple the bit lines of its respective group to at least a first bias node or a second bias node.

19 Claims, 24 Drawing Sheets

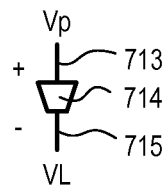
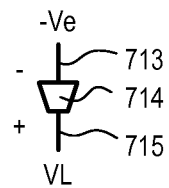
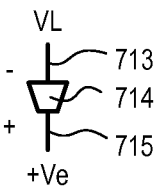
FIG. 7A-0        FIG. 7A-1        FIG. 7A-2
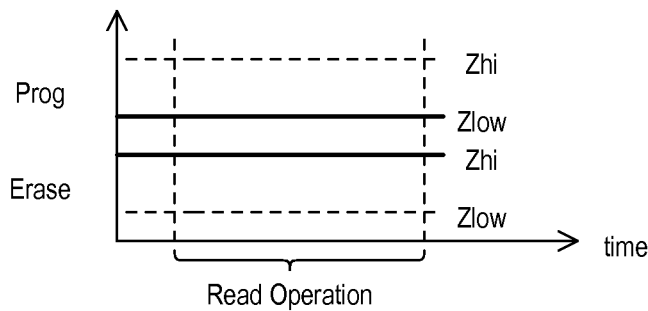
FIG. 7A-3
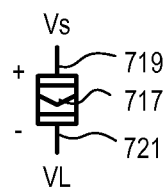
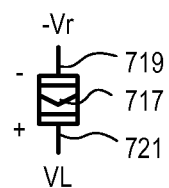
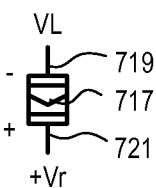
FIG. 7B-0        FIG. 7B-1        FIG. 7B-2
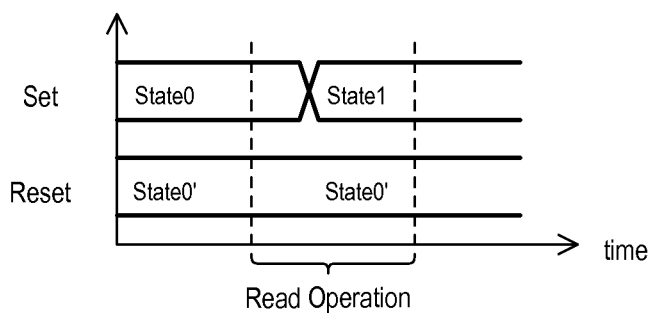
FIG. 7B-3

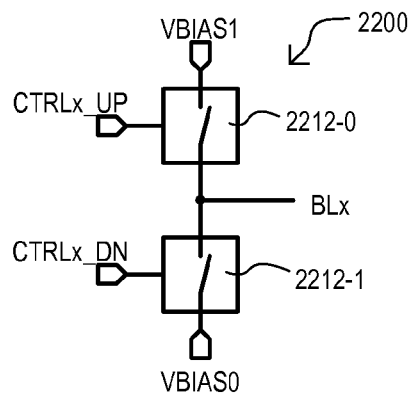
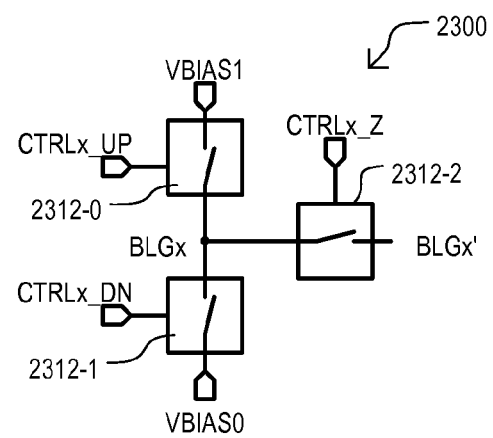
FIG. 22    FIG. 23
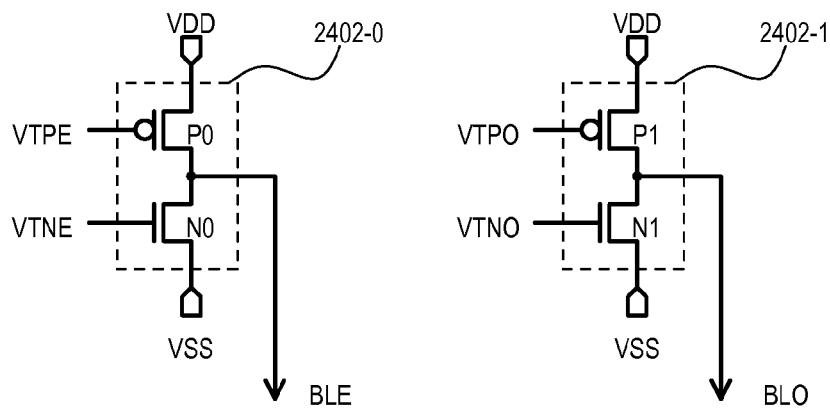
FIG. 24

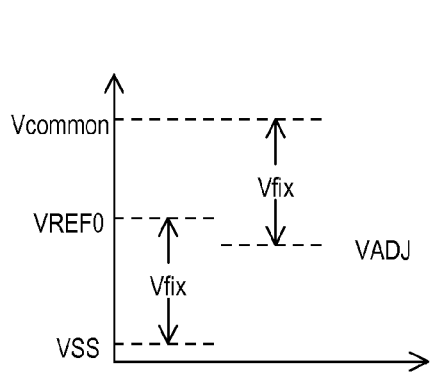
FIG. 41A
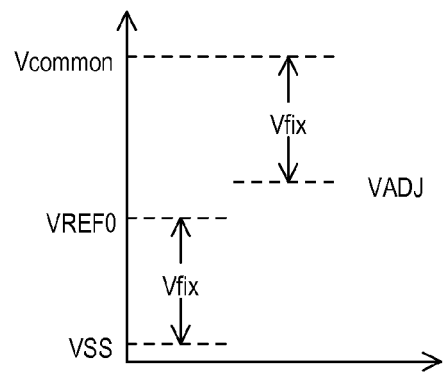
FIG. 41B
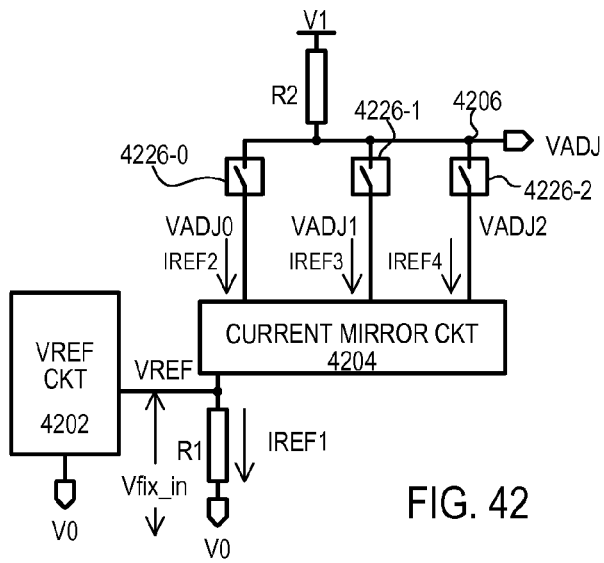
FIG. 42
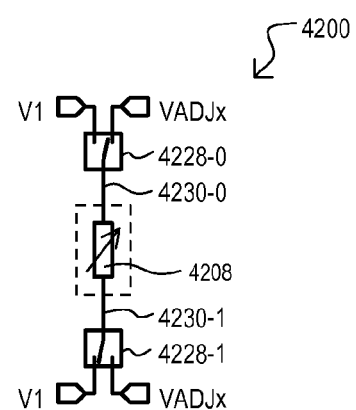
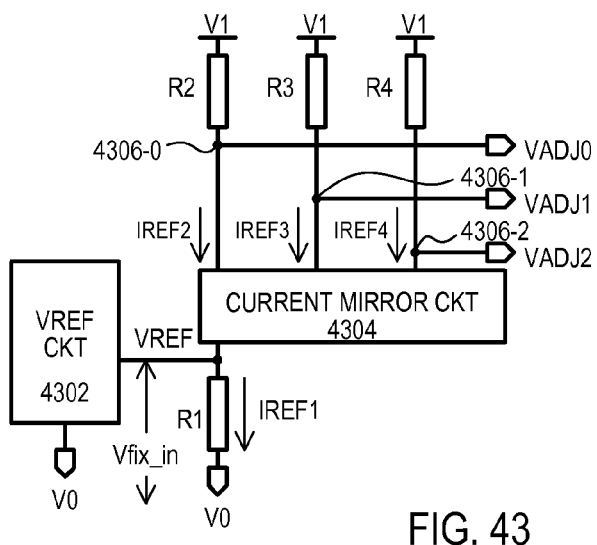
FIG. 43
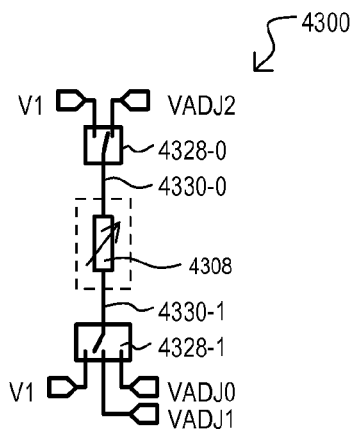

CURRENT SOURCE CIRCUITS AND METHODS FOR MASS WRITE AND TESTING OF PROGRAMMABLE IMPEDANCE ELEMENTS

This application is a continuation of U.S. patent application Ser. No. 12/980,752 filed on Dec. 29, 2010, which claims the benefit of U.S. Provisional Patent Application Ser. No. 61/291,744, filed on Dec. 31, 2009. The contents of all of these applications are incorporated by reference herein.

TECHNICAL FIELD

The present invention relates generally to integrated circuit devices, and more particularly, to integrated circuit devices having variable impedance elements that may be programmed to have different properties.

BACKGROUND OF INVENTION

Integrated circuit memory device typically rely on one or more memory elements to store a data value in a memory cell. Data values may be established within memory elements by write operations. Write operation may include random access writes that write data units (e.g., bytes, words, double words, etc.) into addressed memory cells. In addition, write operations may include "erase" or "program"-type writes, in which all memory cells are written (e.g., erased) with one value (e.g., "0"). Subsequently, according to input write data, some memory cells are written (e.g., programmed) with another value (e.g., "1").

Memory types currently enjoying wide application in electronic devices include dynamic random access memories (DRAMs) and "flash" electrically erasable and programmable read-only-memories (EEPROMs). DRAMs may store data values according to charge stored by capacitive storage memory elements. Flash EEPROMs may store data values according to charge retained within a floating gate or insulator structure. However, as device geometries continue to shrink, and power consumption requirements become more strict, DRAMs and EEPROMs are looking less desirable as memory devices of choice.

Some alternative memory types include resistive RAMs and/or phase change RAMs. A drawback to such memories has been temperature sensitivity of storage elements despite attempts to vary materials of such elements to reduce such temperature sensitivity.

BRIEF DESCRIPTION OF THE DRAWINGS

FIGS. 7A-0 to 7A-3 show write conditions and read responses according to one embodiment.

FIGS. 7B-0 to 7B-3 show write conditions and read responses according to another embodiment.

FIGS. 22 to 24 show current source circuits that may be included in embodiments.

FIGS. 41A and 41B are graphs showing different operating conditions of a bias circuit according to embodiments.

FIG. 42 is a block schematic diagram of a bias circuit according to another embodiment.

FIG. 43 is a block schematic diagram of a bias circuit according to a further embodiment.

DETAILED DESCRIPTION

Various embodiments of the present invention will now be described in detail with reference to a number of drawings. The embodiments show circuits and methods for writing data to memory elements, where such write operations may vary in response to changes in temperature. Such approaches are in contrast to conventional arrangements which rely solely on memory element material composition and/or fabrication processes to attempt to introduce temperature stability into a memory element structures.

Figure 1:
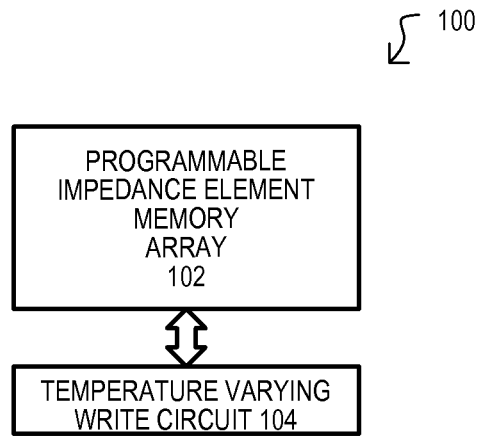
FIG. 1 is a block schematic diagram of a memory device having temperature varying write conditions according to a first embodiment.

Referring now to FIG. 1, a memory device according to a first embodiment is shown in a block diagram and designated by the general reference character 100. A memory device 100 may include a programmable impedance element memory array 102 (hereinafter "memory array") and a temperature varying write circuit 104.

A memory array 102 may include a number of programmable impedance elements that may be programmed between two or more impedance states. Different impedance states may include both static impedance responses and dynamic impedance responses. A static read impedance responses may include memory elements maintaining substantially a same impedance before and after read (i.e., sensing) operations. In contrast, a dynamic read response may include inducing a change in memory element impedance during a read operation. In one particular embodiment, such programmable impedance elements may have write features that vary with temperature. For example, a write time (i.e., the time required to establish a one or more particular impedance states) may vary with temperature.

In some embodiments, programmable impedance elements may include an ion conductor layer that may be programmable between two or more impedance states by application of one more electrical pulses. In particular embodiments, such programmable impedance elements may be two terminal elements, with ion conductor material being disposed between two electrodes. In a very particular embodiment, programmable impedance elements may include programmable metallization cells (PMCs) (sometimes also referred to as conductive bridging random access memory (CBRAM)), having an ion conductor layer, an "active" electrode (that may be formed from a material that may ion conduct within the ion conductor) and an "indifferent" electrode (that may not be formed from a material that may ion conduct within the ion conductor). Write operations to such PMCs may include program operations that lower a resistance of the PMCs, as well as erase operations that raise a resistance of the PMCs (relative to the programmed state (s)).

According to embodiments, write characteristics of programmable impedance elements may vary with temperature. For example, as temperature decreases the amount of energy needed to establish a particular impedance response (e.g., impedance or time to change impedance under read conditions) may increase.

In a very particular embodiment, programmable impedance elements may include PMCs, where, as temperature decreases, a write time may increase (i.e., a write time may be inversely related to temperature). It is understood, that such an "inverse" relationship between a write feature and temperature should not necessarily be construed as a linear relationship, as the relationship may vary according to materials and/or structures of a programmable impedance elements. For example, in some PMCs there may be an exponential relationship between write voltage time with respect to decreasing temperature.

A temperature varying write circuit 104 (hereinafter write circuit) may alter write conditions based on temperature. For example, electrical conditions (e.g., write voltage, write current) may be changed in response to a sensed temperature. In some embodiments, a duration of an electrical write signal (e.g., pulse duration and/or number of pulses) may be varied in response to temperature, while the amplitude of such signals remains substantially constant. In other embodiments, electrical signals may not vary time, but vary in other ways, including but not limited to: constant level (i.e., voltage or current amplitude), peak voltage (or current), signal dynamic waveform, signal electrical power, to name but a few. In still other embodiments, both signal duration and amplitude may be varied in response to temperature.

In addition or alternatively, a write circuit 104 may change a temperature within all or a portion of memory array 102 to alter write characteristics for the memory array 102 as compared to writes performed at an ambient temperature of the device.

In this way, a memory device may alter the electrical conditions utilized to establish data states in programmable impedance elements in response to changes in temperature. Such actions may compensate for memory elements that are sensitive to changes in temperature. In particular embodiments, a memory device may maintain substantially constant write times over a range of temperatures, to provide advantageously predictable device operation.

Figure 2:
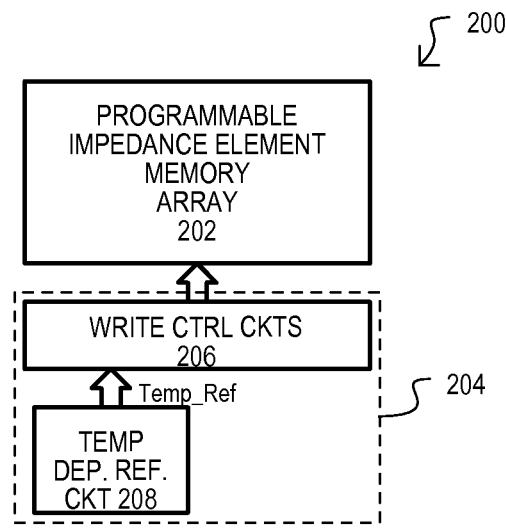
FIG. 2 is a block schematic diagram of a memory device having temperature varying electrical conditions according to another embodiment.

Referring now to FIG. 2, a memory device according to another embodiment is shown in a block diagram and designated by the general reference character 200. A memory device 200 may include a programmable impedance element memory array 202 (hereinafter "memory array") and a temperature varying write circuit 204. A memory array 202 may be subject to the same variations as memory array 102 described in FIG. 1, and in one very particular arrangement, a memory device 200 may be one implementation of that shown in FIG. 1.

A temperature varying write circuit 204 (hereinafter write circuit) may include a write control circuit 206 and a temperature dependent reference circuit 208. A temperature dependent reference circuit 208 may generate at least one reference value (Temp_Ref) that varies according to a sensed temperature of the memory device 200. Such a reference value may be provided to write control circuit 206.

A write control circuit 206 may provide one or more write electrical values to memory array 202 to thereby write data values to programmable impedance elements (i.e., cause changes in their static impedance and/or dynamic impedance response). A write control circuit 206 may vary one or more write electrical values in response to the reference value from temperature dependent reference circuit 208. Accordingly, as a temperature of memory device 200 varies, a write control circuit 206 may alter electrical write values to compensate for the effect of such temperature changes on write properties of programmable impedance elements within memory array 202.

In particular embodiments, a memory device 200 may be an integrated circuit (IC) device with memory array 202, write control circuit 206 and a temperature dependent reference circuit 208 all being formed in a same integrated circuit package. For example, an integrated circuit package may include multiple ICs (i.e., dice), with one temperature dependent reference circuit serving multiple dice. In other embodiments, a memory device 200 may be formed on a single IC device with memory array 202, write control circuit 206 and a temperature dependent reference circuit 208 all being formed in a same integrated circuit substrate.

In this way, a memory device may include a temperature dependent reference circuit local to an IC and/or IC device package that may sense the temperature of programmable impedance elements within the same IC/IC package to enable temperature varying write operations to such programmable impedance elements.

Figure 3:
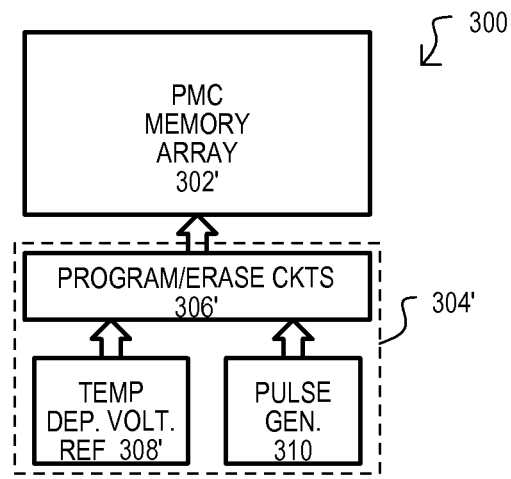
FIG. 3 is a block schematic diagram of a memory device according to a further embodiment.

Referring now to FIG. 3, a memory device according to another embodiment is shown in a block diagram and designated by the general reference character 300. A memory device 300 may include a programmable metallization cell (PMC) memory array 302' (hereinafter "PMC array") and a temperature varying write circuit 304. In one very particular arrangement, a memory device 300 may be one example of that shown in FIG. 1 an/or FIG. 2.

FIG. 3 may differ from FIGS. 1 and 2 in that memory array 302' specifically includes PMCs, and temperature varying write circuit 304' (hereinafter write circuit) may specifically include program/erase circuit 306', a temperature dependent voltage reference circuit 308' (hereinafter "voltage reference circuit"), and a pulse generator 310.

A PMC array 302' may include PMCs arranged into rows and columns that have at least one terminal accessible by temperature varying write circuit 304. In one particular embodiment, a PMC array 302' may include PMCs having terminals commonly connected to receive one or more write voltages, either directly, or by way of switching circuits. For example, multiple PMCs may have anodes (or conversely cathodes) connected together at a common node. Such a common node may be maintained at one voltage, as temperature varying write voltages from write circuit 304' are applied via switching paths to an opposing terminal of the PMCs. As another example, multiple PMCs may have anodes (or conversely cathodes) connected together at a common node, and such a common node may be driven with temperature varying write voltages from write circuit 304'.

In addition or alternatively, each PMC may have an anode (or conversely a cathode) connected to a conductive line by an access device. Such a conductive line may be driven with a temperature write voltage from write circuit 304'.

In this way, one or more temperature write voltages may be applied selectively to individual PMCs and/or collectively to PMCs of a same group.

Within write circuit 304', a voltage reference circuit 308' may generate a voltage that varies according to sensed temperature. In one embodiment, voltage reference circuit 308' may generate a program voltage having an absolute value that decreases as temperature increases. In addition or alternatively, voltage reference circuit 308' may generate an erase voltage having an absolute value that decreases as temperature increases. A pulse generator 310 may generate one or more pulses for writing data into PMC array 302'. In one embodiment, pulse widths do not substantially vary over temperature changes in memory device 300.

A program/erase circuit 306 may apply write pulses in response to pulses received from pulse generator 310. Program/erase circuit 306 may alter an amplitude of such pulses according to the generated program voltage and/or erase voltage provided by voltage reference circuit 308. In particular embodiments, write pulses may remain substantially constant while an amplitude of such pulses vary with temperature, to thereby compensate for changes in write time arising from changes in temperature.

In this way, a memory device having programmable impedance elements may provide substantially uniform write times despite variations in operating temperature.

Figure 4A:
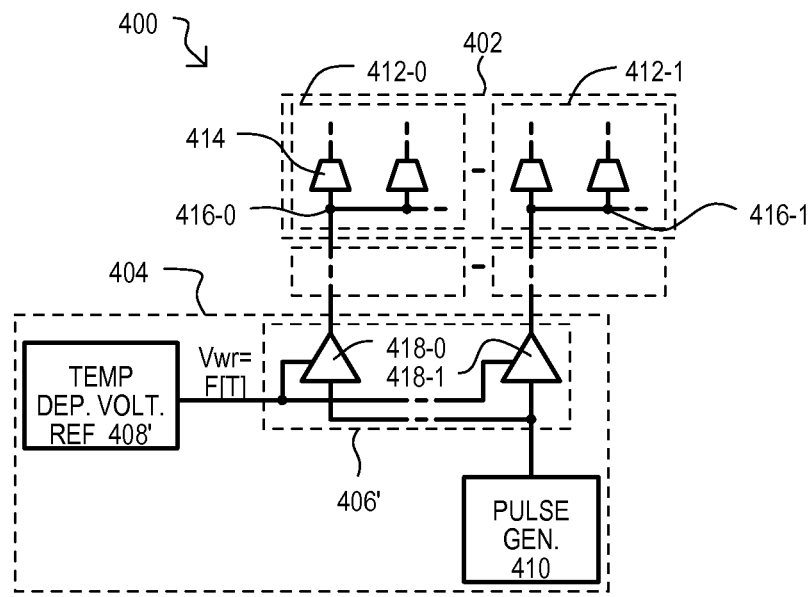
FIGS. 4A and 4B are a block schematic diagram showing memory devices according to other embodiments.

Referring now to FIG. 4A, a memory device according to a further embodiment is shown a block schematic diagram and designated by the general reference character 400. A memory device 400 may include a programmable metallization cell (PMC) memory array 402 (hereinafter "PMC array") and a temperature varying write circuit 404.

In one very particular arrangement, a memory device 400 may be one example of that shown in any of FIGS. 1, 2 and/or 3.

A PMC array 402 may include PMCs (one shown as 414) arranged into PMC groups 412-0/1. Within each PMC group 412-0/1, PMCs may have anodes connected to a common node 416-0/1. However, in alternate embodiments, PMCs of a same group may have cathodes commonly connected to a common node. Common nodes 416-0/1 may be connected directly or indirectly (e.g., by way of column or array decoder circuits) to temperature varying write circuit 404.

A temperature varying write circuit 404 (hereinafter write circuit) may include write circuit 406', a temperature dependent voltage reference circuit 408' (hereinafter voltage reference circuit), and a pulse generator 410. Voltage reference circuit 408' may generate a write voltage Vwr having a value that is a function of sensed temperature F[T]. Such a write voltage Vwr may be provided to program/erase circuit 406'.

A pulse generator 410 may generate one or more pulses for writing data into PMC array 402. In one embodiment, pulse widths do not substantially vary over temperature changes in memory device 400.

A write circuit 406' may include a number of write drivers 418-0/1 that receive a pulse input from pulse generator 410 as well as write voltage Vwr. In response to such values, write drivers 418-0/1 may output one or more program voltage pulses having an amplitude corresponding to write voltage Vwr, as well as a pulse duration corresponding to pulse generator 410.

In this way, write circuit may apply write pulses to PMCs having amplitudes that may vary according to temperature.

Figure 4B:
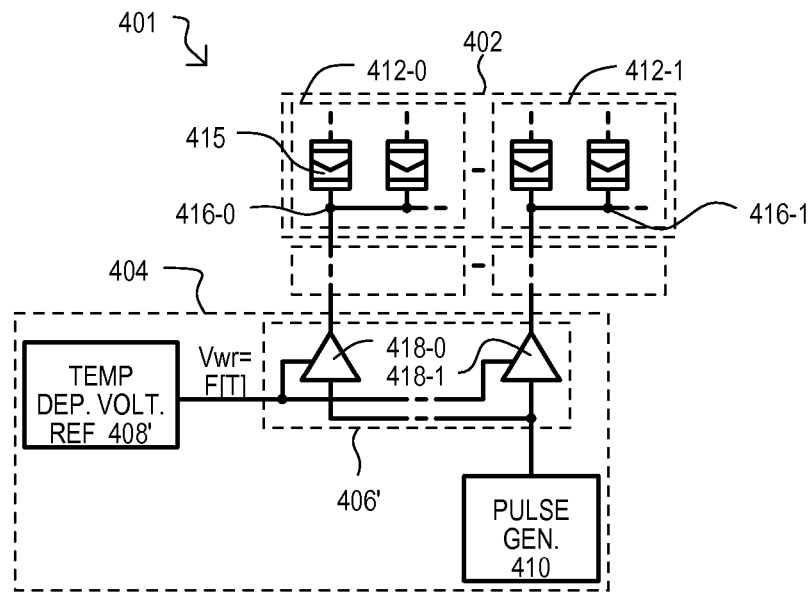

Referring now to FIG. 4B, a memory device according to another embodiment is shown a block schematic diagram and designated by the general reference character 401. A memory device 401 may include sections like those shown in FIG. 4B. However, unlike FIG. 4B, a memory array 402 may include programmable impedance elements (one shown as 415) that provide a dynamic change in impedance during a read operation. That is, an impedance (e.g., conductance, capacitance) of such elements may change in a read operation.

In this way, write circuit may apply write pulses having amplitudes that may vary according to temperature to memory elements that provide a dynamic impedance response during a read operation.

Figure 5:
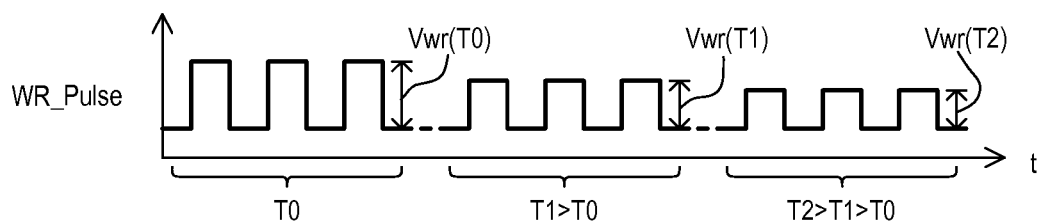
FIG. 5 is a timing diagram showing write pulses that may be generated according to embodiments.

Referring now to FIG. 5, a graph shows one very particular example of voltage write pulses (WR_Pulse) that may be generated according to embodiments. An amplitude of write pulses may vary according to temperature. FIG. 5 shows three different temperatures T0, T1 and T2, where T0<T1<T2. In the particular embodiment shown, as temperature increases, a pulse amplitude may be decreased. Thus, at a first temperature T0, a pulse may have an amplitude Vwr(T0). At a second temperature T1, that is higher than T0, a pulse may have an amplitude Vwr(T1), which may be less than Vwr(T0). At a third temperature T2, that is higher than T0 and T1, a pulse may have an amplitude Vwr(T2), which may be less than Vwr(T0) and Vwr(T1).

Such an arrangement may be used for programmable impedance elements having write times that may decrease with increases in temperature and decrease with write voltage magnitude. In one particular arrangement, pulse durations may remain essentially constant over all temperatures, with write pulse amplitude being varied according to temperature to ensure adequate writing.

However, in other embodiments write pulse amplitudes may decrease as temperature increases.

In this way, a write pulse amplitude may vary as temperature varies.

Figure 6A:
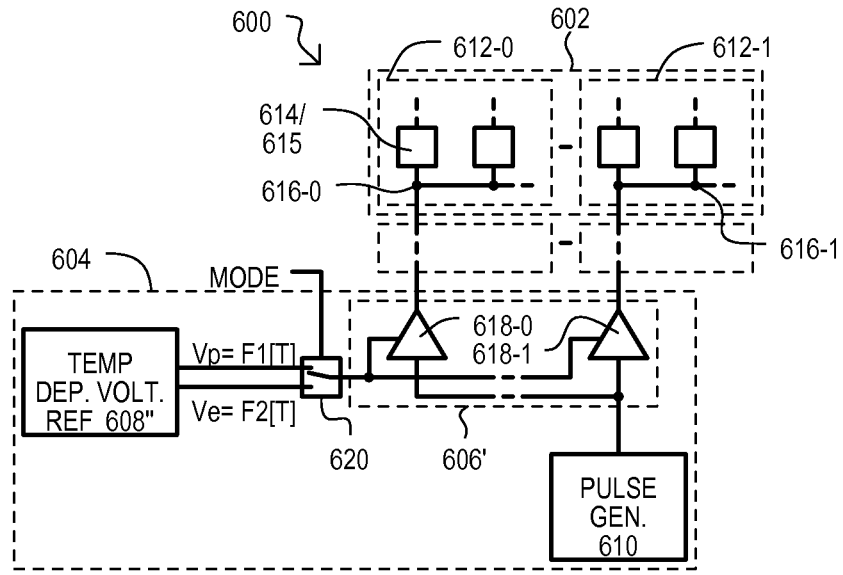
FIGS. 6A and 6B are a block schematic diagram showing memory devices according to other embodiments.

Referring now to FIG. 6A, a memory device according to another embodiment is shown in a block schematic diagram and designated by the general reference character 600. A memory device 600 may include sections like those shown in FIGS. 4A and 4B. In one very particular arrangement, a memory device 600 may be one example of that shown in FIGS. 1, 2, 3 and/or 4A/B.

A memory device 600 may differ from that of FIGS. 4A/B in that a temperature dependent voltage reference circuit 608' may generate two write voltages, a program voltage Vp that is a function of temperature F1[T], as well as an erase voltage Ve that is also a function of temperature F2[T]. In one embodiment, a program voltage Vp may correspond to a writing one data value into a memory element (e.g., logic "1"), while an erase voltage Ve may correspond to a writing of another data value into a memory element (e.g., logic "0").

A switching circuit 620 may selectively apply a write voltage to write amplifiers 618-0/1 based on mode information MODE. In one particular embodiment, when mode information (MODE) indicates a program operation, switching circuit 620 may provide Vp to write drivers 618-0/1 to enable program voltage pulses with amplitudes that vary according to temperature. In a similar fashion, when mode information (MODE) indicates an erase operation, switching circuit 620 may provide Ve to write drivers 618-0/1 to enable program erase pulses with amplitudes that vary according to temperature.

In the embodiment of FIG. 6A, a memory array is shown to include memory elements 614/615. Such memory elements may include programmable impedance elements having static impedance responses (like those shown in FIG. 4A) and/or programmable impedance elements having dynamic impedance responses (like those shown in FIG. 4B).

In this way, a memory device may include program and erase voltages that vary in response to changes in temperature.

Figure 6B:
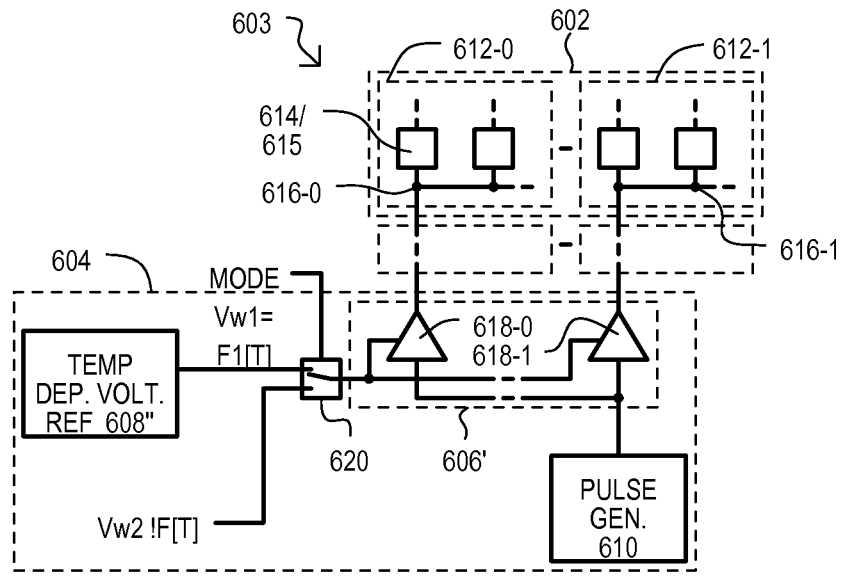

Referring now to FIG. 6B, a memory device according to another embodiment is shown in a block schematic diagram and designated by the general reference character 603. A memory device 603 may include sections like those shown in FIG. 6A, and may be one example of that shown in FIGS. 1, 2, 3 and/or 4A/B.

A memory device 603 may differ from that of FIG. 6A in that a temperature dependent voltage reference circuit 609 may generate one write voltage (Vw1) that is a function of temperature F3[T], while another provided write voltage (Vw2) does not substantially vary according to temperature !F[T]. Application of a temperature varying write voltage (Vw1) may correspond to a writing of one data value (e.g., 0 or 1), while application of a non-temperature varying write voltage (Vw2) may correspond to a writing of another data value (e.g., 1 or 0).

In this way, a memory device may write one data value to programmable impedance elements with a write voltage that varies in response to changes in temperature, and may write another data value to programmable impedance elements with a write voltage that does not vary in response to changes in temperature.

Referring now to FIGS. 7A-0 to 7A-3, application of write conditions to PMC elements is shown according to an embodiment, along with a resulting impedance response. FIGS. 7A-0 to 7A-2 show a PMC 714 having two terminals, including an anode 713 and a cathode 715. Various write conditions are shown, including one program operation and two erase operations.

FIG. 7A-0 shows one example of program conditions according to an embodiment. In such a program operation, an electric field created across a PMC 714 may have one polarity (shown by + and −). In the particular embodiment shown, a program voltage Vp may be applied to an anode of PMC 714 that is positive with respect to a reference voltage VL applied to a cathode of PMC 714. Further, a total voltage across a PMC 714 (Vp−VL) may decrease as a temperature increases, and vice versa. As but a few examples, a program voltage Vp may grow smaller as temperature increases. A reference voltage VL may not be temperature varying, and in one particular embodiment may be a low power supply voltage, such as ground. Alternatively, a reference voltage VL may vary in an opposite fashion with respect to temperature than program voltage Vp. That is, if voltage Vp gets smaller as a temperature rises, a voltage VL may grow larger as a temperature rises.

FIG. 7A-1 shows one example of erase conditions according to an embodiment. In the erase operation shown, an electric field created across a PMC 714 may have an opposite polarity (shown by − and +) to that of a program operation, like that shown in FIG. 7A-0. An erase voltage −Ve may be applied to an anode of PMC 714 that is negative with respect to a reference voltage VL applied to a cathode of PMC 714. In such an erase operation, a total voltage across a PMC 714 (VL−(−Ve)) may decrease as a temperature increases, and vice versa. As but a few examples, an erase voltage −Ve may grow less negative as temperature increases. A reference voltage VL may not be temperature varying, and in one particular embodiment may be a low power supply voltage, such as ground. Alternatively, a reference voltage VL may vary in an opposite fashion with respect to temperature than erase voltage −Ve. That is, if voltage −Ve gets larger (i.e., less negative) as a temperature rises, a voltage VL may grow smaller as a temperature rises.

FIG. 7A-2 shows one example of voltages applied in an alternative erase operation. An erase voltage +Ve may be applied to a cathode of PMC 714 that is positive with respect to a reference voltage VL applied to an anode of PMC 714. In such an erase operation, a total voltage across a PMC 714 (Ve−VL) may decrease as a temperature increases, and vice versa. As but a two examples, an erase voltage +Ve may grow smaller as temperature increases. A reference voltage VL may not be temperature varying, and in one particular embodiment may be a low power supply voltage, such as ground. Alternatively, a reference voltage VL may vary in an opposite fashion with respect to temperature than erase voltage +Ve. That is, if voltage +Ve gets smaller (i.e., less negative) as a temperature rises, a voltage VL may grow larger as a temperature rises.

FIG. 7A-3 is a graph showing an example of impedance response of PMC elements programmed and erased according to embodiments herein. FIG. 7A-3 shows a sense/read response of a programmed PMC (Prog) and an erased PMC (Erase). As shown, in a read operation, a programmed PMC may maintain a substantially constant impedance (Zlow), while an eased PMC may maintain a substantially higher constant impedance (Zhi).

It is understood that in some embodiments, a program voltage (e.g., Vp) may be temperature dependent, while erase voltages (e.g., −Ve, +Ve) may not be temperature dependent. In other embodiments, a program voltage (e.g., Vp) may not be temperature dependent, while an erase voltage (e.g., −Ve or +Ve) may be temperature dependent. In still other embodiments, both program and erase voltages may be temperature dependent.

In this way, different polarity write conditions may establish data values in programmable impedance devices, with at least one write condition including a temperature dependent value.

Referring now to FIGS. 7B-0 TO 7B-3, application of write conditions to dynamically switching programmable impedance elements according to an embodiment are shown, along with a resulting impedance response. FIGS. 7B-0 to 7B-2 show a programmable impedance element 717 having two terminals, including a first terminal 719 and a second terminal 721. Various write conditions are shown, including one "set" operation and two "reset" operations.

FIG. 7B-0 shows one example of set operation that may create a polarity across the terminals of element 717 as described in the PMC programming operation. However, electrical conditions may be smaller in magnitude (i.e., lower voltage, shorter duration, lower current, etc.) than the PMC case. In the particular embodiment shown, a set voltage Vs may be decrease as a temperature increases, and vice versa, while a reference voltage VL may not be temperature varying. Alternatively, a reference voltage VL may vary in an opposite fashion with respect to temperature than set voltage Vs. That is, if voltage Vs gets smaller as a temperature rises, a voltage VL may grow larger as a temperature rises.

FIG. 7B-1 shows one example of reset conditions. In the reset operation shown, an electric field created across a element 717 may have an opposite polarity to that of a set operation, like that shown in FIG. 7B-0. A reset voltage −Vr may be negative with respect to a reference voltage VL. In one embodiment, a total voltage across an element 717 may decrease as a temperature increases, and vice versa.

FIG. 7B-2 shows another reset operation. A reset voltage +Vr may be positive with respect to a reference voltage VL. In such a reset operation, a total voltage across an element 717 may decrease as a temperature increases, and vice versa.

FIG. 7B-3 is a graph showing an example of impedance response of dynamic response programmable impedance elements set and reset according to embodiments herein. FIG. 7B-3 shows a sense/read response of set element (set) and a reset element (reset). As shown, in a read operation, a set element may undergo a change in state (state 0 to state 1), while a reset element may substantially maintain its initial state. It is understood that a change in state may be a change in conductance and/or a change in capacitance, as but two examples.

It is understood that write voltages (e.g., Vp, −Ve, +Ve, VL, Vs, +Vr and/or −Vr) may be applied in one or more pulses across terminals of a PMC. Further, such voltages may be applied directly or indirectly by way of one or more switching paths.

Figure 8:
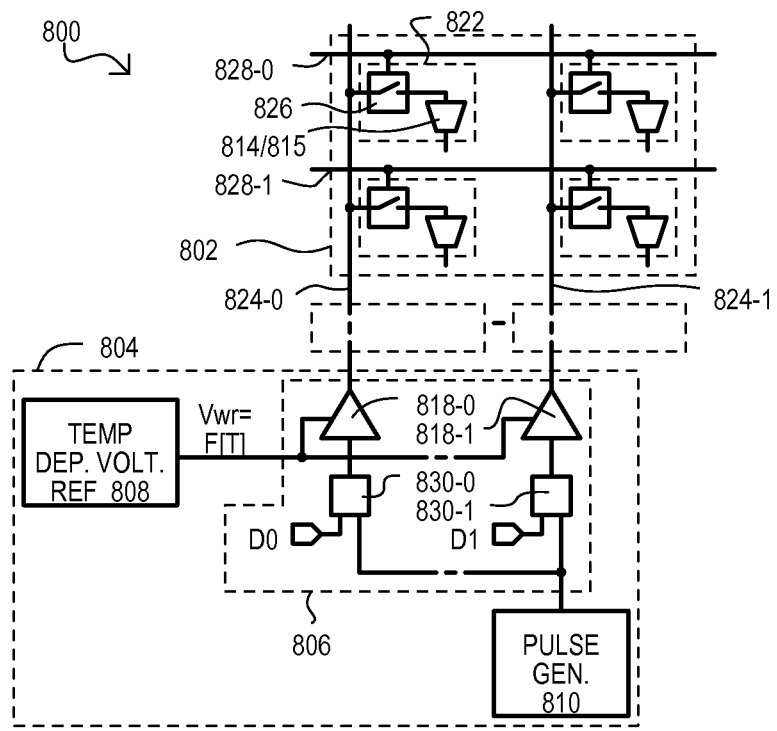
FIG. 8 is a block schematic diagram of a memory device according to a further embodiment.

Referring now to FIG. 8, a memory device according to still another embodiment is shown in a block schematic diagram, and designated by the general reference character 800. A memory device 800 may have many of the same items as FIGS. 4A and 4B. In very particular arrangements, a memory device 800 may be one example of that shown in FIGS. 1, 2, 3, 4A/B and/or 6A/B. Further, the embodiment of FIG. 8 shows elements 814/815, which may include programmable impedance elements having static impedance responses (like those shown in FIG. 4A) and/or programmable impedance elements having dynamic impedance responses (like those shown in FIG. 4B).

A memory device 800 further shows how a write circuit 804 may apply a temperature dependent write conditions based upon input write data values, and shows how programmable elements may be included within memory cells having access devices.

Referring still to FIG. 8, a memory array 802 may include memory cells (one shown as 822), each of which may include an programmable impedance element (one shown as 814/815) connected to a corresponding bit line 824-0/1 by an access device 826. Access devices (e.g., 826) of a same row may be commonly controlled by a corresponding word line 828-0/1.

A write circuit 804 may include a write circuit 806 having write drivers 818-0/1 with outputs connected to bit lines 824-0/1, respectively, either directly or indirectly. In addition, write inhibit circuits 830-0/1 may be connected between pulse generator 810 and inputs of write drivers 818-0/1. Write inhibit circuits 830-0/1 may each receive an input write data value D0/1. According to such a data value (D0/1), write inhibit circuits 830-0/1 may enable or disable a write operation for write drivers 818-0/1. Thus, based on an input write data value (e.g., D0, D1), a temperature dependent write condition (in this example, write voltage Vw) may be applied to selected memory cells.

In an alternate embodiment, rather than enable/disable write drivers, input write data values D0/1 may selectively enable paths between outputs of write drivers and bit lines.

It is noted that while some write operations in a device may be data dependent, other write operations may not be data dependent. As but one example, in one type of write operation (e.g., writing a data value "1"), may be based on input write data values, while other write operations (e.g., writing a data value "0") may be not be based on input write data values. Even more particularly, according to some embodiments, a group of elements may first be collectively written with one data value (e.g., "0"), then particular of such elements may be selectively written to another data value (e.g., "1") based on input write data. One or both of the writing operations may have conditions that are temperature dependent.

In this way, temperature dependent write conditions may be selectively applied to memory elements based on input write data values.

Figure 9:
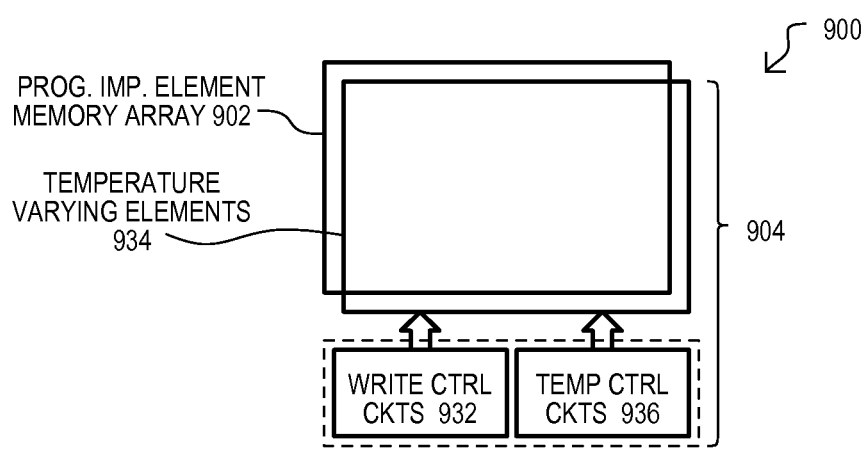
FIG. 9 is a block schematic diagram of a memory device having temperature controlled write conditions according to a further embodiment.

Referring now to FIG. 9, a memory device according to a further embodiment is shown in a block diagram and designated by the general reference character 900. A memory device 900 may include a programmable impedance element memory array 902 (hereinafter "memory array") and a temperature varying write circuit 904. A memory array 902 may be subject to the same variations as memory array 102 described for FIG. 1 and equivalents.

In one very particular arrangement, a memory device 900 may be one example of that shown in FIG. 1.

A temperature varying write circuit 904 (hereinafter write circuit) may include a write control circuit 932, temperature varying elements 934, and a temperature control circuit 936. A write control circuit 932 may apply write voltage to programmable impedance elements within memory array 902.

Temperature varying elements 934 may be structures formed in proximity to corresponding programmable impedance elements within memory array 902. Temperature varying elements 934 may be activated to raise and/or lower a temperature of programmable impedance elements and thereby allow write operations to occur in a given time. In one particular embodiment, there may be one temperature varying element for each programmable impedance element. However, in alternate embodiments, one temperature varying element may alter a temperature of more than one programmable impedance element.

A temperature control circuit 936 may enable temperature varying elements 934 to cause such elements to change temperature and thereby change a temperature of programmable impedance elements within memory array 902.

In a write operation, temperature control circuit 936 may activate temperature varying elements 934. In addition, write control circuit 932 may write data to programmable impedance elements having temperatures changed by temperature varying elements 934.

In very particular embodiments, temperature varying elements may be heating elements that raise a temperature of one or more corresponding programmable impedance elements. As but one very particular example, heating elements may be resistive heating elements having temperatures that increase in response to a heating current (e.g., Joule heating). In other embodiments, temperature varying elements may be cooling elements that lower a temperature of one or more corresponding programmable impedance elements. As but one very particular example, cooling elements may be thermoelectric elements (e.g., rely on the Peltier effect).

Temperature varying elements may heat (or cool) corresponding programmable impedance elements before data are written to such elements and/or while data are written to such elements.

In this way, a memory device may alter a temperature of programmable impedance elements as part of a write operation. Such actions may also compensate for memory elements that are sensitive to changes in temperature, and enable substantially constant write times over a range of temperatures for advantageously predictable device operation.

Figure 10:
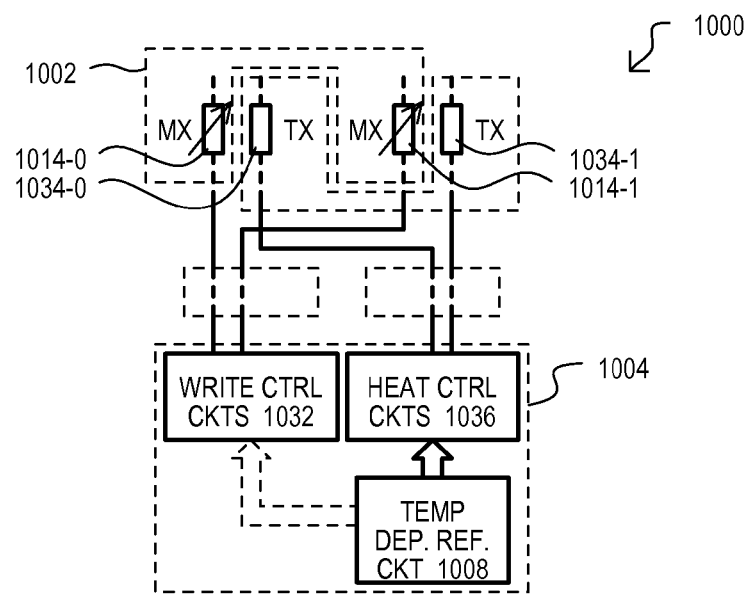
FIG. 10 is a block schematic diagram of a memory device according to a further embodiment.

Referring to FIG. 10, a memory device according to still another embodiment is shown in a block schematic diagram and designated by the general reference character 1000. A memory device 1000 may have many of the same items as FIG. 10, and such like items are referred to by the same reference character, but with the first digits being a "10" instead of a "9".

In one very particular arrangement, a memory device 1000 may be one example of that shown in FIGS. 1 and/or 9.

Referring to FIG. 10, a memory array 1002 may include programmable impedance elements 1014-0/1 formed in proximity to a corresponding heating element 1034-0/1. Programmable impedance elements 1014-0/1 may include elements having static or dynamic read responses as described herein, and equivalents. As will be described in conjunction with other embodiments below, heating elements may be formed over, on the side of, below, or some combination thereof with respect to their corresponding programmable impedance element. A distance between a heating element 1034-0/1 and its corresponding programmable impedance elements 1014-0/1 may be sufficient to enable heat to reach a programmable impedance element 1014-0/1 at a sufficient rate and amount. Consequently, such a distance may vary according to device materials and geometries.

A temperature varying write circuit 1004 may include a write control circuit 1032, heat control circuit 1036, and temperature dependent reference circuit 1008. A temperature dependent reference circuit 1008 may generate at least one reference value that varies according to a sensed temperature of the memory device 1000. Such a reference value may be provided to heat control circuit 1036, and optionally, to write control circuit 1032.

Heat control circuit 1036 may control heating elements 1034-0/1 to heat corresponding programmable impedance elements 1014-0/1. More particularly, heat control circuit 1036 may control a temperature of elements based on a value received from reference circuit 1008. That is, an amount of heat produced by heating elements 1034-0/1 may vary as a sensed temperature varies.

Write control circuits 1032 may write data values into programmable impedance elements by applying an electrical value, such as a current and/or voltage. Optionally, the applied electrical value may vary according to a sensed temperature as described in other embodiments above, or equivalents.

In this way, a memory device may include heating elements to alter a temperature of programmable impedance elements as part of a write operation.

Figure 11:
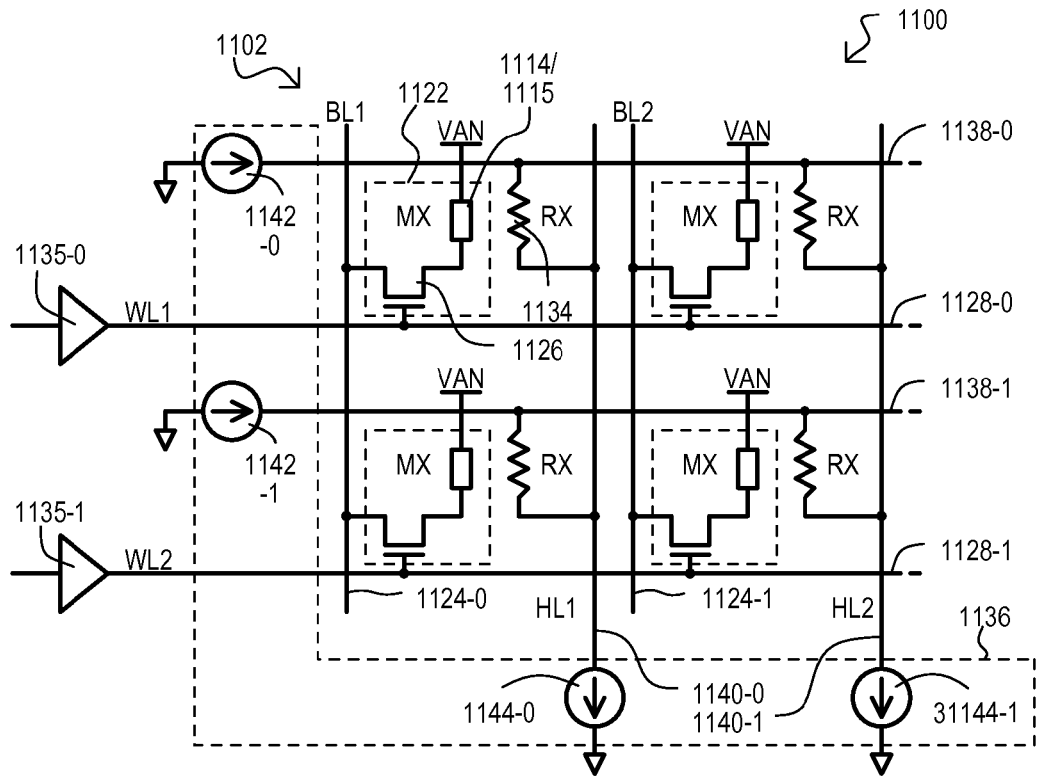
FIG. 11 is a block schematic diagram of a memory device having heating elements according to a further embodiment.

Referring now to FIG. 11, a memory device according to another embodiment is shown in a block diagram and designated by the general reference character 1100. In very particular arrangements, a memory device 1000 may be one example of that shown in any of FIG. 1, 9 or 10.

Referring to FIG. 11, a memory array 1102 may include memory cells (one shown as 1122), each of which may include a memory element (one shown as 1114/1115) connected to a corresponding bit line 1124-0/1 by an access device 1126. Elements (e.g., 1114/1115) may include programmable impedance elements having static and/or dynamic read responses, as described herein and equivalents. One terminal of elements (e.g., 1114/1115) may be commonly connected to common node Vc. Access devices (e.g., 1126) of a same row may be commonly controlled by a corresponding word line 1128-0/1. In the particular example shown, an access device may be an n-channel insulated gate field effect transistor. Word lines 1128-0/1 may be driven by row drivers 1135-0/1.

Heating elements (one shown as 1134) may be resistive heating elements formed in proximity to each element (e.g., 1114/1115) on a one-to-one basis. Heating elements (e.g., 1134) may be arranged in a "cross point" array, with heating elements (e.g., 1134) of a same row having first terminals connected to a heater row line 1138-0/1 and heating elements (e.g., 1134) of a same column having second terminals connected to a heater column line 1140-0/1.

A heat control circuit 1136 may enable current to flow through heating elements (e.g., 1134). In the embodiment of FIG. 11, a heat control circuit 1136 may be conceptualized as providing current sources 1142-0/1 to heater row lines 1138-0/1 and current sinks 1144-0/1 to heater column lines 1140-0/1. It is understood that current source/sink could be as simple as connections to a power supply voltage, but in other embodiments, either or both, may be current control circuits that control an amount of current flowing through a heating element (e.g., 1134).

In this way, a memory device may include a heating element array in conjunction with a memory cell array to heat elements as part of a write operation.

Figure 12:
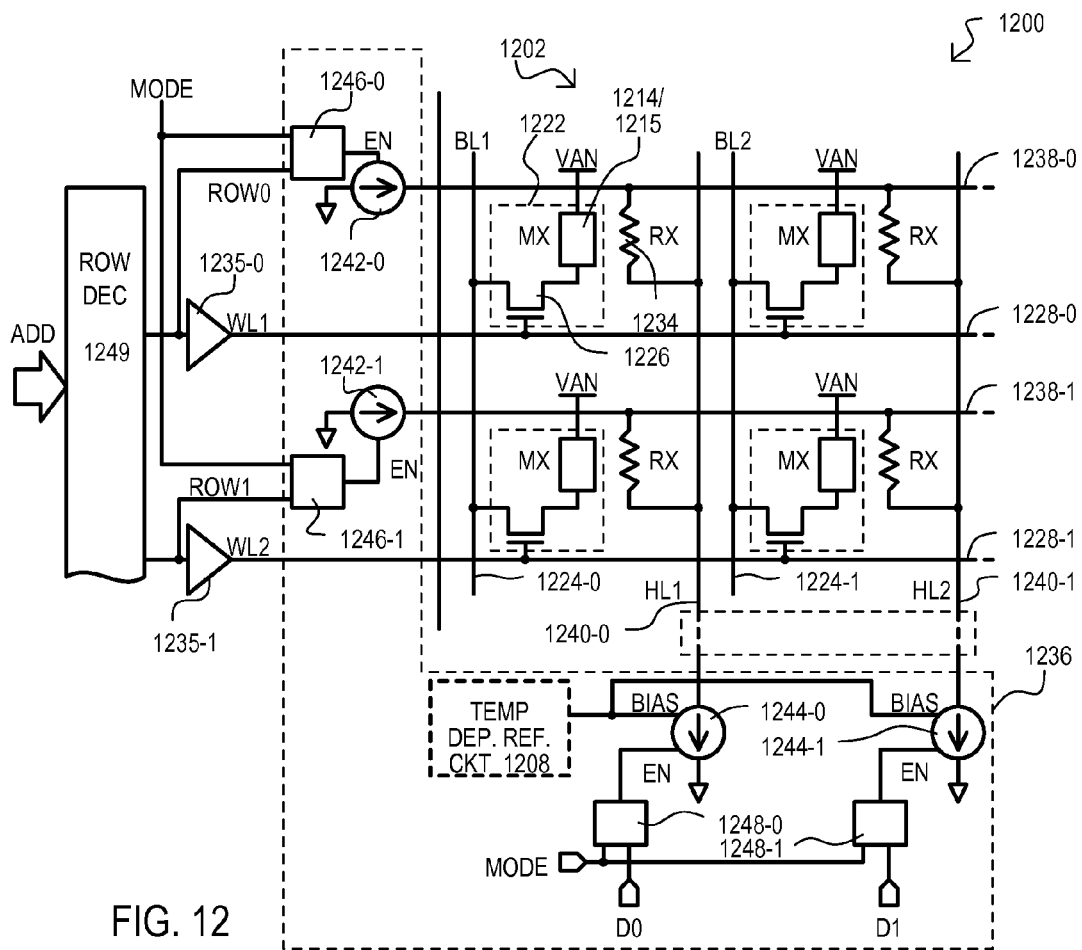
FIG. 12 is a block schematic diagram of another memory device having heating elements according to an embodiment.

Referring to FIG. 12, a memory device according to still another embodiment is shown in a block schematic diagram and designated by the general reference character 1200. In one very particular arrangement, a memory device 1200 may be one example of that shown in any of FIGS. 1, 9 and/or 10.

The embodiment of FIG. 12 may include some of the same items as FIG. 11. Accordingly, like items are referred to by the same reference character but with the first digits being "12" instead of "11".

Referring to FIG. 12, a memory array 1202 may include a row decoder 1249 that receives address data, and in response, provides row activation signals to row drivers 1235-0/1 to select one or more rows for access for a given operation (e.g., read, write).

A heat control circuit 126 may include current sources 1242-0/1 and/or current sinks 1244-0/1 that may be enabled or disabled in response to mode or other data. In the embodiment shown, row heat control circuits 1246-0/1 may generate enable signals for current sources 1242-0/1 in response to row decoder signals ROW0/1 and mode data MODE. MODE data may indicate a given operation. In one very particular example, MODE data may indicate a read operation, a program operation (i.e., a writing of one data value), or an erase operation (writing of another value). In a read operation, current sources 1242-0/1 may be disabled. However, in a program operation, each current source 1242-0/1 may be enabled in response to a row decoder signal ROW0/1. Similarly, in an erase operation, each current source 1242-0/1 may be enabled in response to a row decoder signal ROW0/1. Alternatively, in a group erase operation (e.g., sector erase) current sources 1242-0/1 may enabled together in a group (e.g., sector).

Referring still to FIG. 12, in the embodiment shown, current sinks 1244-0/1 may be enabled by column heat control circuits 1248-0/1. In addition or alternatively, current sinks 1244-0/1 may control the amount of current sunk based on a bias value BIAS. Column heat control circuits 1248-0/1 may generate enable signals for current sinks 1244-0/1 in response to write data D0/1 and mode data MODE. In one embodiment, in a read operation, current sinks 1244-0/1 may be disabled. However, in a program operation, each current sink 1244-0/1 may be enabled or disabled according to a write data value D0/1. As but one very particular example, a memory device 1200 may erase all elements (e.g., 1214/1215) prior to a program operation. Thus, in a program operation, only those elements (e.g., 1214/1215) having a particular data value (e.g., 1=program) are programmed. Accordingly, such programmed elements may be heated, while erased elements that are to remain erased (e.g., 0=erased) may not be heated. Similarly, in an erase operation, each current sink 1244-0/1 may be enabled in response to a data (in the event a memory device 1200 includes a bit erase capability). Alternatively, if a group erase (e.g., sector erase) capability is included, current sources 1244-0/1 may be enabled together in a group to erase multiple column positions together.

As noted above, in the embodiment of FIG. 12 a BIAS value may determine a magnitude of current drawn by a current sink 1244-0/1. Optionally, a BIAS value may be generated by a temperature dependent reference circuit 1208, and thus may vary according to temperature. Accordingly, a heating of heating elements (e.g., 1214) may change as temperature changes. In one embodiment, a magnitude of a current may smaller as a sensed temperature rises.

It is noted that in other embodiments, a magnitude of a current source may be varied by a temperature dependent value.

In this way, a memory device may include heating elements that may be selectively enabled in response to write data values to heat programmable impedance elements as part of a data write operation.

Figure 13A:
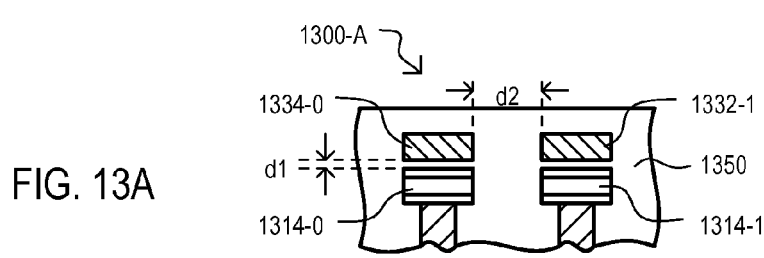
FIGS. 13A to 13C show heating elements and memory element orientations according to various embodiments.
Figure 13B:
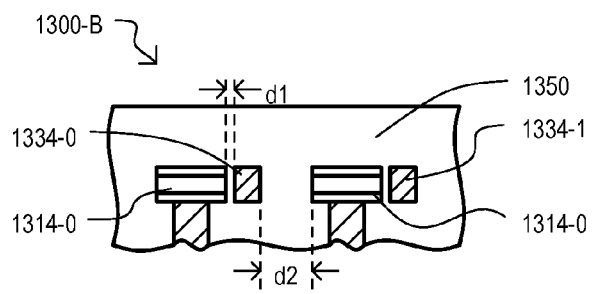
Figure 13C:
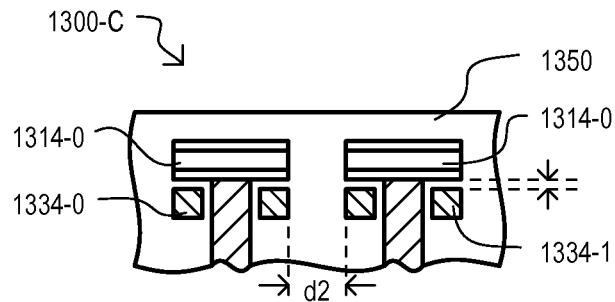

Referring now to FIGS. 13A to 13C, examples of how heating elements may be oriented with respect to corresponding programmable impedance elements.

Referring to FIG. 13A, a heating element 1334-0/1 may be formed over a corresponding programmable impedance element (1314-0/1). In one very particular embodiment, heating elements 1334-0/1 may be separated from programmable impedance elements (1314-0/1) by one or more dielectric layers 1350 forming a distance (d1). Further, adjacent heating elements (1334-0/1) may be separated from one another with one or more dielectric layers 1350 by a second distance (d2). The first distance may be smaller than a second distance (d1<d2).

FIG. 13B shows how a heating element 1334-0/1 may be formed to a side of a corresponding programmable impedance element (1314-0/1). In one very particular example, a first distance (d1) may be smaller than a second distance (d2), as in the manner of FIG. 13A.

FIG. 13C shows how a heating element 1314-0/1 may be formed below a corresponding programmable impedance element (1314-0/1). In one very particular example, a first distance (d1) may be smaller than a second distance (d2), as in the manner of FIG. 13A.

Other embodiments may include a heating element formed adjacent to multiple surfaces of a corresponding programmable impedance element.

Figure 14:
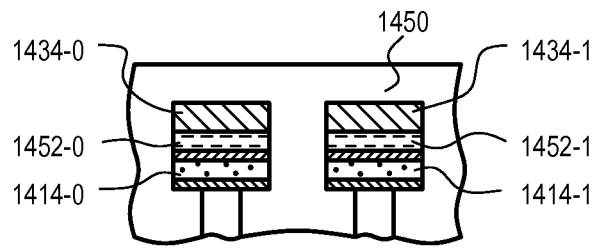
FIG. 14 shows heating element and memory element orientation according to another embodiment.

FIG. 14 shows a cross sectional view showing a very particular example of how heating elements (144-0/1) may be separated from a corresponding programmable impedance element (1414-0/1) by a heat conductor 1452-0/1.

In one very particular example, heating elements 1434-0/1 and programmable impedance elements 1414-0/1 may be separated from one another by one or more dielectric layers 1450. A heat conductor 1452-0/1 may have a higher thermal conductivity than dielectric layer(s) 1450.

Other embodiments may have heating elements separated from corresponding programmable impedance elements with a heat conductor on sides other than, or in addition to, a top surface.

As noted above, temperature varying elements may be enabled prior to and/or during write operations to a programmable impedance element. Particular embodiments of such write operation will now be described.

Figure 15A:
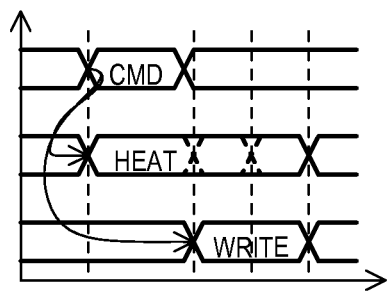
FIGS. 15A and 15B are timing diagrams showing heating operations in conjunction with write operations according to an embodiment.
Figure 15B:
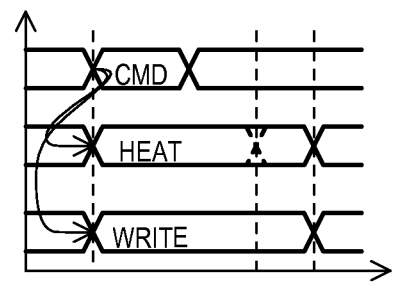

Referring to FIGS. 15A and 15B, timing diagrams show the execution of heating operations (HEAT) in conjunction with corresponding write operations (WRITE) in response to a command data (CMD). Heat operations (HEAT) may be those operations that cause heating elements to heat corresponding programmable impedance elements. Such heat operations may ensure a given write speed for a memory device having programmable impedance elements regardless of a device ambient temperature. Alternatively, such heat operations may increase a write speed or that which would occur at an ambient temperature. Write operations (WRITE) may apply write data to programmable impedance elements. Write operation may or may not include electrical properties (e.g., write pulse voltages) that vary according to a sensed temperature.

FIG. 15A shows how heating operations (HEAT) may begin prior to write operations (WRITE) in response to command data (CMD). Such heat operations may terminate prior to, during, coincident with, or after the termination of the corresponding write operation.

FIG. 15B shows how heating operations (HEAT) may begin at substantially the same time as a corresponding write operation (WRITE) in response to command data (CMD).

Such heat operations may terminate prior to, during, coincident with, or after the termination of the corresponding write operation.

Having described the devices and methods in various diagrams, methods according to other embodiments will now be described with reference to a number of flow diagrams.

Figure 16:
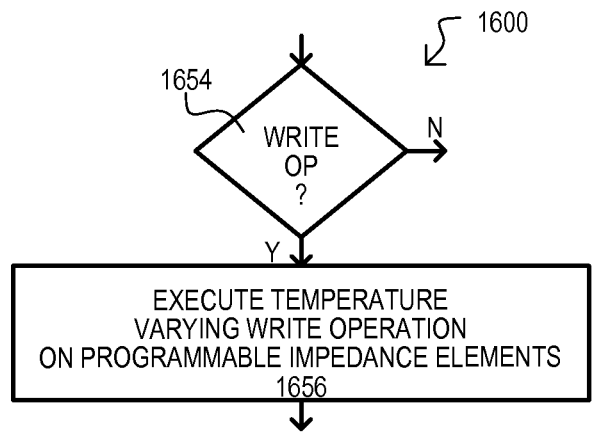
FIG. 16 is a flow diagram of a write method according to an embodiment.

Referring now to FIG. 16, a method according to an embodiment is shown in a flow diagram and designated by the general reference character 1600. A method 1600 may include determining if a write operation is to be performed (1654). In particular embodiments, such an action may include decoding a received command, and/or receiving control signals having predetermined values.

If a write operation is to be performed (Y from 1654), a temperature varying write operation may be executed on programmable impedance elements (1656). Such an action may include altering electrical properties utilized in write operations based on temperature, or varying a temperature of such elements, or some combination thereof.

As in embodiments described above, write operations to programmable impedance elements may result in elements having static response during read operations and/or dynamic responses during read operations.

Figure 17:
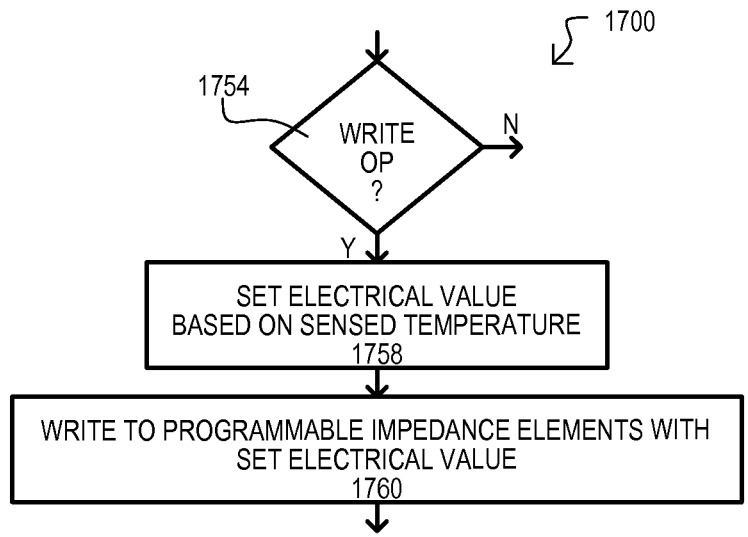
FIG. 17 is a flow diagram of a write method according to another embodiment.

Referring now to FIG. 17, a method according to another embodiment is shown in a flow diagram and designated by the general reference character 1700. A method 1700 may include determining if a write operation is to be performed (1754). Such an action may include operations like noted for 1654 of FIG. 16, or equivalents.

If a write operation is to be performed (Y from 1754), an electrical value may be set based on a sensed temperature (1758). Such an action may include determining a temperature of a device, and based on such a sensed temperature, setting a voltage and/or current value. In one particular embodiment, a circuit having a proportional to absolute temperature (PTAT) or a complementary to absolute temperature (CTAT) resistive element may be utilized to generate a variance in response to sensed temperature.

A method 1700 may further include writing to programmable impedance elements with the set electrical values (1760). Such an action may include applying a voltage, current, or some combination thereof (where such values may vary in response to a sensed temperature) to programmable impedance elements to alter an impedance of such elements. It is understood that such a variance in response to temperature may include differences in amplitude and/or duration of electrical signals, as described in embodiments above. Writing may establish static responses in memory elements, or dynamic responses as described above.

In addition or alternatively, such an action (1760) may include applying a temperature dependent, voltage, current, or some combination thereof to heating elements in order to heat programmable impedance elements prior to, or while data is being written into such programmable impedance elements.

Figure 18:
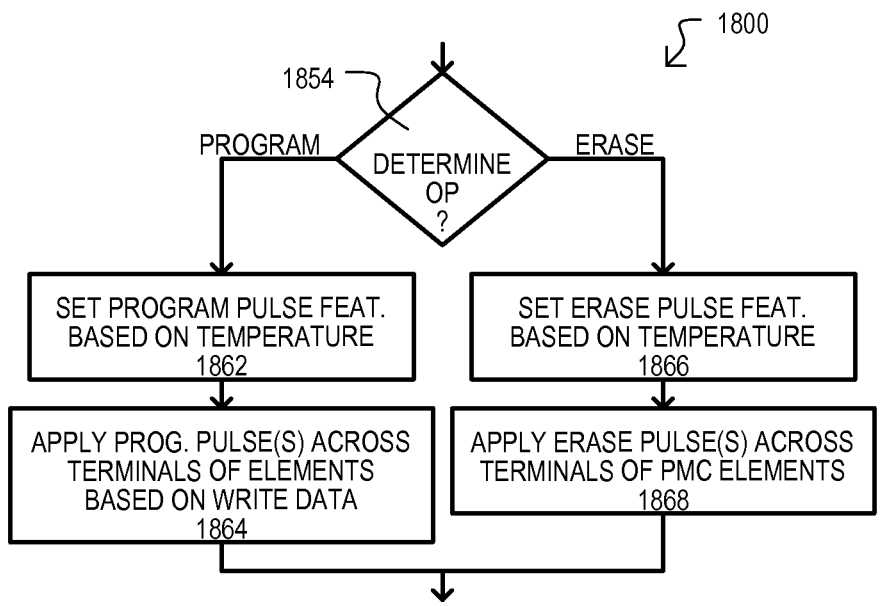
FIG. 18 is a flow diagram of a write method according to a further embodiment.

Referring now to FIG. 18, a method according to further embodiment is shown in flow diagram and designated by the general reference character 1800. A method 1800 may include determining if a type of write operation that is to be performed (1854). Such an action may include determining if a write operation is to write one value (e.g., 0) or another value (e.g., 1). In very particular embodiments, such an action may determine if an erase operation or program operation is to be performed on programmable impedance elements. In some embodiments, a program operation may establish a state that causes an element to dynamically change properties (e.g., conductance, capacitance) within a read time period, while an erase operation may cause an element to substantially maintain its properties within the read time period. Alternatively, a program operation may establish a relatively low impedance in an element, while an erase operation may establish a relatively high impedance in an element. In very particular embodiments, this may include determining if PMC elements are to be programmed to a low resistance or erased to a high resistance.

If a program operation is to be performed (PROGRAM from 1854), program pulse features may be set based a sensed temperature (1862). Such an action may include using one or more circuit elements having a proportional to absolute temperature (PTAT) impedance or a complementary to absolute temperature (CTAT) impedance to generate a voltage or current. Such a voltage or current may be utilized as an amplitude of a program pulse, or may be scaled to generate such a program pulse amplitude. In addition, or alternatively, such an action may include establishing a number of program pulses or pulse duration based on a temperature. A method 1800 may also include applying one or more program pulses across terminals of programmable impedance elements based on write data (1864). Such an action may include selectively applying program pulses to elements based on write data. Even more particularly, such an action may include applying program pulses to particular columns if a write data bit has one value (e.g., 1).

If an erase operation is to be performed (ERASE from 1854), erase pulse features may be set based a sensed temperature (1866). Such an action may include using one or more circuit elements having a PTAT or CTAT features to establish pulse amplitude, number and/or duration, as but a few examples. A method 1800 may also include applying one or more erase pulses across terminals of a group of elements (1868). Such an action may include applying erase pulses to elements regardless of write data. Even more particularly, such an action may include applying erase pulses to a group of columns.

Accordingly, in the embodiment of FIG. 18 one type of write operation (e.g., program) may write data values based on write data, while another type of write operation (e.g., erase) may write data values without regard to write data.

Figure 19:
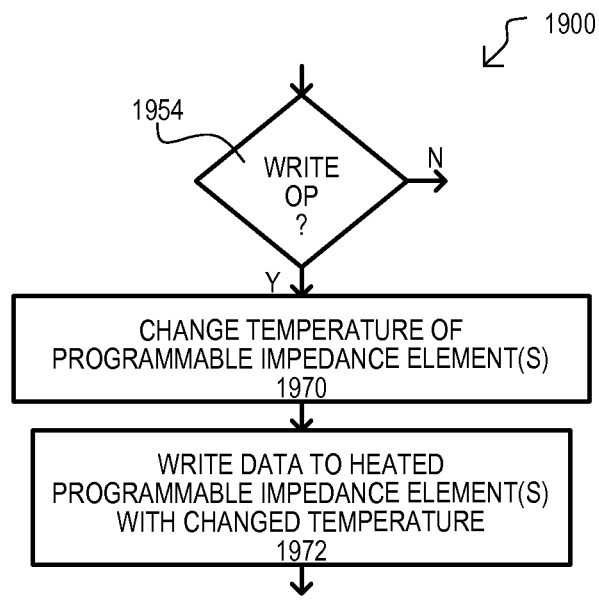
FIG. 19 is a flow diagram of a write method according to another embodiment.

Referring now to FIG. 19, a further method according to an embodiment is shown in flow diagram and designated by the general reference character 1900. A method 1900 may include determining if a write operation is to be performed (1954). Such an action may include operations like noted for 1654 of FIG. 16, or equivalents.

If a write operation is to be performed (Y from 1954), a temperature of programmable impedance elements may be changed (1970). Such an action may include heating or cooling programmable elements as a group and/or on an individual basis.

A method 1900 may further include writing to programmable impedance elements with changed temperatures (1970). Such an action may include applying a voltage, current, or some combination thereof, to programmable impedance elements to alter an impedance of such elements. Such an applied voltage/current may, or may not be, vary in response to a sensed temperature.

Figure 20:
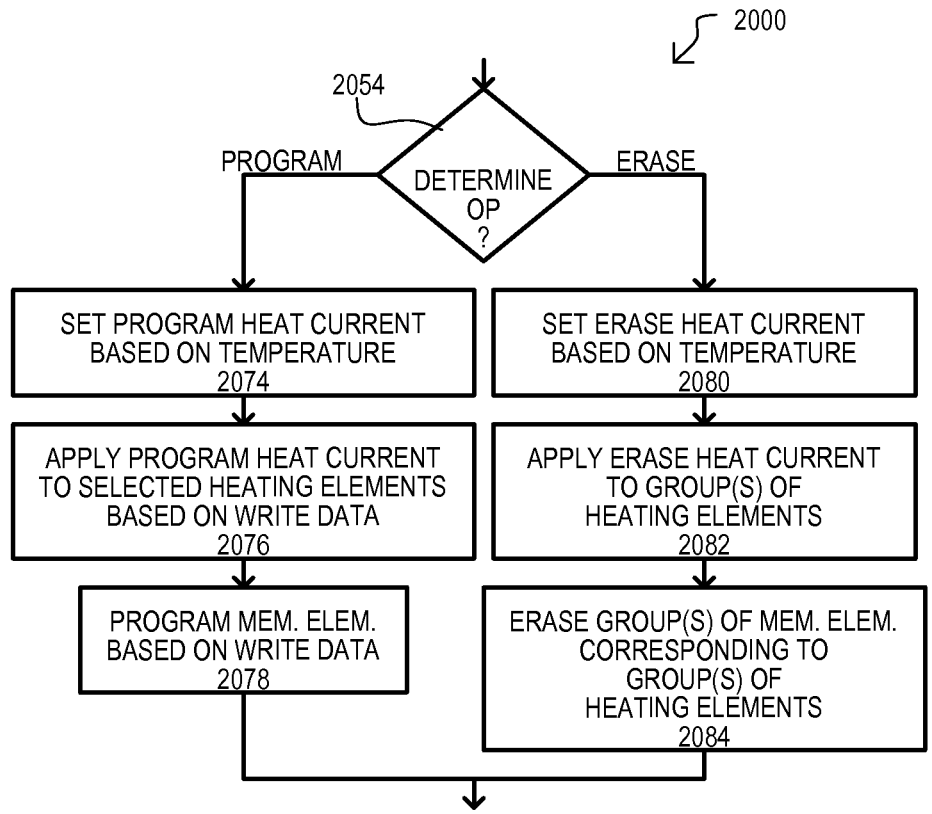
FIG. 20 is a flow diagram of a write method according to another embodiment.

FIG. 20 shows another method 2000 according to further embodiment. A method 2000 may include determining a type of operation that is to be performed (2054). Such an action may include operations like noted for 1854 of FIG. 18, or equivalents.

If a program operation is to be performed (PROGRAM from 2054), a heat current may be set based on a sensed temperature (2074). Such an action may include using one or more circuit elements having features that are proportional to absolute temperature (PTAT) or a complementary to absolute temperature (CTAT). A method 2000 may also include applying a heat current to selected heating elements based on write data (2076). Such an action may selectively enable current paths through heating elements to heat only elements that are being programmed. A method 2000 may further include programming element based on write data (2078). Such an action may include programming those elements (or a subset thereof) heated in step 2076.

If an erase operation is to be performed (ERASE from 2054), a heat current may be set based on a sensed temperature (2080). Such an action may include using one or more circuit elements having PTAT or CTAT features to generate a heat current. A method 2000 may also include applying a heat current to a group of heating elements (2082). Such an action may enable current paths through heating elements to heat a group of elements that are being erased together. A method 2000 may further include erasing group(s) of elements corresponding to heated groups of elements (2084).

Having described embodiments with temperature varying write operations to memory elements, additional embodiments having electrical signal applying elements will now be described. It is understood that such embodiments may include temperature varying write circuits and methods as described above.

Figure 21A:
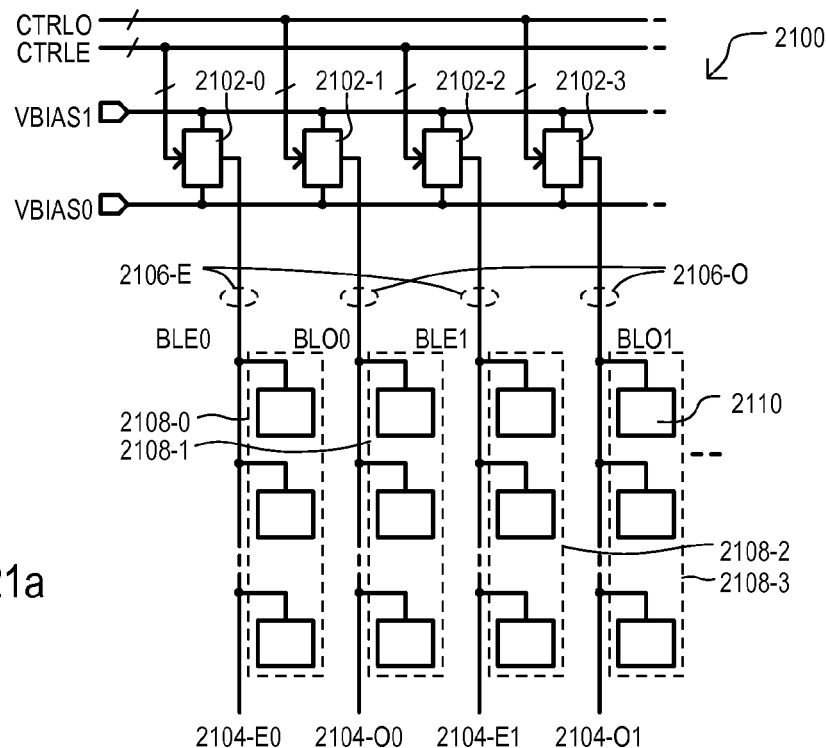
FIGS. 21a and 21b are block schematic diagrams of memory devices having current source circuits for group writing and/or testing according to an embodiment.

FIG. 21a shows a memory device 2100 according to one embodiment that includes current source circuits 2102-0 to 2102-3 and bit lines 2104-E0 to 2104-O1. Current source circuits 2102-0 to 2102-3 may each receive two or more bias voltages (VBIAS0/1) and may operate independently in response to control signals CTRLE and CTRLO, respectively. In particular, in response to control signals CTRLE, current source circuits 2102-0,2 . . . may connect a bit line group 2106-E to one of the bias voltages VBIAS0 or VBIAS1. In response to control signals CTRLO, current source circuits-1,3 . . . may connect a bit line group 2106-O to one of the bias voltages VBIAS0 or VBIAS1.

Bit lines (2104-E0 to 2104-O1) may be divided into groups. In the particular embodiment shown, bit lines (2104-E0 to 2104-O1) may be divided into an "even" bit line groups 2106-E that includes bit lines 2104-E0,1 and an "odd" bit line group 2126-O that includes bit lines 2104-O0,1. Each bit line (2104-E0 to 2104-O1) may be connected to a corresponding current source circuit (2102-0 to 2102-3).

Each bit line (2104-E0 to 2104-O1) may be connected to a corresponding group of memory cells 2108-0 to 2108-3. Each memory cell (one shown as 2110) may include one or more programmable impedance elements. A programmable impedance element may be an element that may be programmed, by application of a voltage and/or current, to two or more different impedances.

Figure 21B:
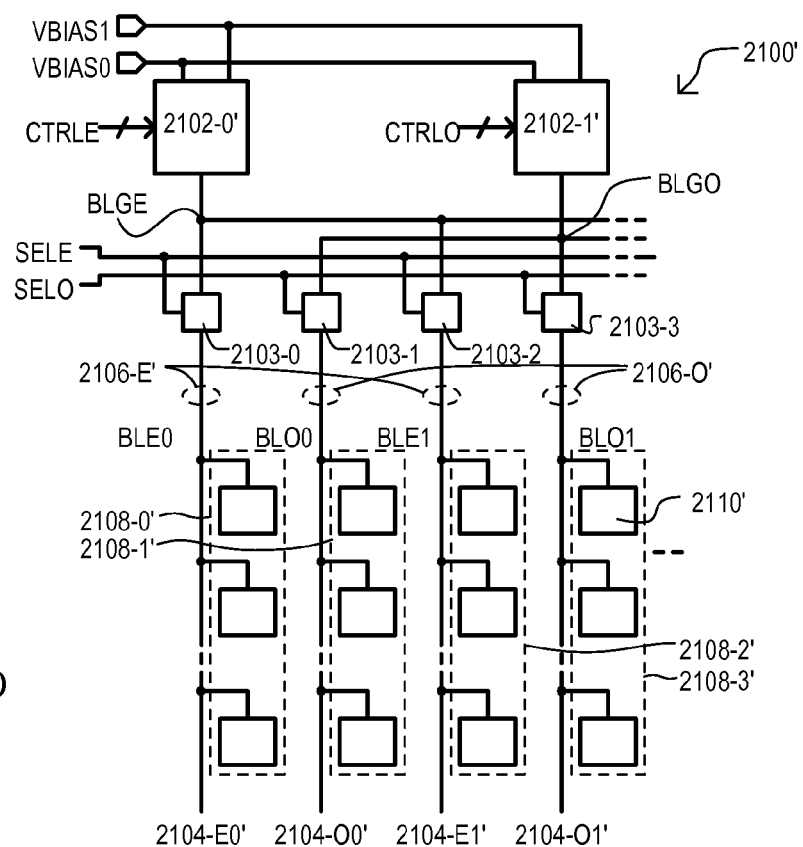

FIG. 21b shows an alternate embodiment in which select devices 2103-0,2 . . . 2103-3 may connect even bit line group 2106-E', directly or indirectly (e.g., by column switch or decoder circuits) to bit line group node BLGE. Similarly, select devices 2103-1,3 . . . may connect odd bit line group 2106-O', directly or indirectly, to bit line group node BLGO. In such an arrangement, current source 2102-0' may drive bit lines of even bit line group 2106-E' substantially simultaneously, and current source 2102-1' may drive bit lines of odd bit line group 2106-O' substantially simultaneously.

In an arrangement like that of FIGS. 21a and 21b, bit lines may be simultaneously driven to bias voltages to enable mass write operations. Further, because bit lines are divided into different groups, such mass write operations may write different values to different locations (i.e., one group written with 0s, while the other group is written with 1s). Such groupings of bit lines with corresponding current sources may also allow for test operations that drive groups of bit lines simultaneously to test for defects.

While FIGS. 21a and 21b show bit lines of different groups alternating with one another, other embodiments may include a different grouping arrangement.

It is understood that a write operation as described herein for the various embodiments may include a writing of programmable impedance elements between two or more impedance states. Different impedance states may include both static impedance responses and dynamic impedance responses. A static read impedance response may include memory elements maintaining substantially a same impedance before and after read (i.e., sensing) operations. In contrast, a dynamic read response may include inducing a change in memory element impedance during a read operation. In one very particular embodiment, programmable impedance elements may be programmable metallization cells (PMCs) that may be programmed to relatively low impedance values, and erased to relatively high impedance values.

FIG. 22 shows one particular example of a current source circuit 2200 that may be included in the embodiments. Current source circuit 2200 may include a first switch element 2212-0 and second switch element 2212-1. In response to a control signal CTRLx_UP, a bit line BLx may be connected to, or isolated from, a bias voltage VBIAS1 by first switch element. Similarly, in response to control signal CTRLx_DN, a bit line BLx may be connected to, or isolated from, a bias voltage VBIAS0 by second switch element 2212-1.

Accordingly, if signal CTRLx_UP is active and signal CTRLx_DN is inactive, bit line BLx may be connected to voltage VBIAS1. If signal CTRLx_UP is inactive and signal CTRLx_DN is active, bit line BLx may be connected to voltage VBIAS0. If signals CTRLx_UP and CTRLx_DN are both inactive, bit line BLx may be isolated (i.e., presented with a high impedance with respect to current source circuit 2200).

FIG. 23 shows another particular example of a current source circuit 2300 that may be included in the embodiments. Current source circuit 2300 may include a first switch element 2312-0 and second switch element 2312-1 that operate like elements 2312-0 and 2312-1, respectively, of FIG. 22. Current source circuit 2300 may further include a third switch element 2312-2 between nodes BLGx and BLGx'. In response to a control signal CTRLx_Z, third switch element 2312-3 may connect or isolate node BLGx from BLGx'.

Accordingly, if signals CTRLx_UP and CTRLx_Z are active, and signal CTRLx_DN is inactive, output bit line group node BLGx' may be connected to voltage VBIAS1. If signal CTRLx_UP is inactive, and signals CTRLx_DN and CTRLx_Z are active, output bit line group node BLGx' may be connected to voltage VBIAS0. If signal CTRLx_Z is inactive, output bit line group node BLGx' may be isolated (i.e., presented with a high impedance with respect to current source circuit 2330).

It is understood that output bit line group node BLGx' may be connected directly or indirectly to a group of bit lines.

FIG. 24 shows further examples of current source circuits 2402-0/1 may be included in the embodiments. Current source circuits 2402-0/1 may have a same structure. Accordingly, only current source circuit 2402-0 will be described in detail. In the embodiment of FIG. 4, current source circuits 2402-0/1 may receive bias voltages that are a high power supply voltage VDD and a low power supply voltage VSS.

Current source circuit 2402-0 may include a p-channel transistor P0 and an n-channel transistor N0. Transistor P0 may have a source-drain path between a bias voltage VDD and a bit line BLE (or bit line group), and a gate that receives a signal VTPE. Transistor N0 may have a source-drain path between a bias voltage VSS and a bit line BLE, and a gate that receives a signal VTNE. In one embodiment, transistor P0 and/or N0 may provide impedances that may be controlled according to their corresponding gate signals VTPE and VTNE. In addition or alternatively, transistor P0 and/or N0 may function as a current limiter to limit a maximum current flowing to (or from) bit line BLE. Still further, in other embodiments, when activated, signals VTPE and/or VTNE may place corresponding transistors P0 and N0 in a saturated mode of operation.

Accordingly, if signal VTPE is active and signal VTNE is inactive, bit line group node BLGE may be connected to voltage VDD. If signal VTPE is inactive and signal VTNE is active, bit line BLE (or bit line group) may be connected to voltage VSS. If signals VTPE and VTNE are both inactive, bit line BLE (or bit line group) may be isolated (i.e., presented with a high impedance with respect to current source circuit 2402-0).

It is understood that current source circuits (2402-0/1) may be connected directly or indirectly to a bit line or group of bit lines. Further, while current source circuits 2402-0/1 are shown to receive power supply voltages VDD and VSS, in other embodiments, a source of p-channel transistors may receive a voltage greater than or less than a high power supply voltage VDD. Similarly, in other embodiments, a source of n-channel transistors may receive a voltage greater than or less than a low power supply voltage VSS.

Figure 25:
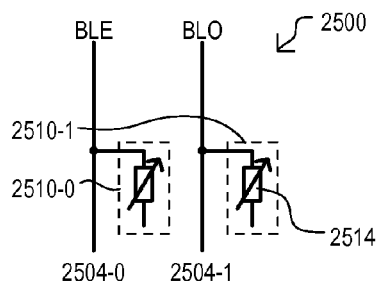
FIGS. 25 to 30 show memory arrays that may be included in embodiments.

FIG. 25 shows one example of a memory cell array 2500 that may be included in the embodiments. Memory cell array 2500 may include bit lines 2504-0/1 connected to memory cells 2510-0/1.

The particular example of FIG. 25 shows a "cross point" type array in which memory cells 2510-0/1 may each include programmable impedance elements (one shown as 2514) may be directly connected to a corresponding bit line. Such elements may have dynamic and/or static responses during a read operation.

It is understood that each of bit lines 2504-0/1 may be connected to multiple memory cells (only one memory cell per bit line is shown in the figure).

Figure 26:
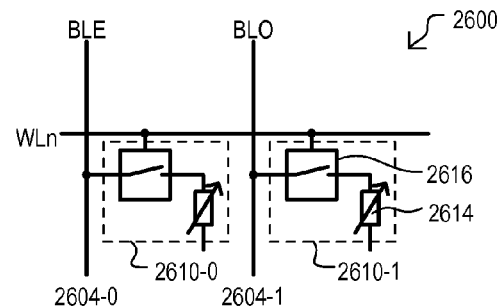

FIG. 26 shows another example of a memory cell array 2600 that may be included in the embodiments. Memory cell array 2600 may have an arrangement like that of FIG. 25, however, memory cells 2610-0/1 may include programmable impedance elements (one shown as 2614) that may be connected to a corresponding bit line by an access devices (one shown as 2616).

It is understood that each of bit lines 2604-0/1 may be connected to multiple memory cells.

Figure 27:
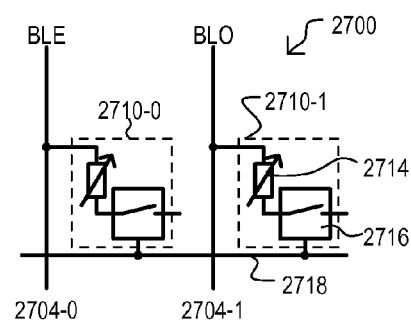

FIG. 27 shows another example of a memory cell array 2700 that may be included in the embodiments. Memory cell array 2700 may have an arrangement like that of FIG. 26. However, memory cells 2710-0/1 may include programmable impedance elements (one shown as 2714) that are directly connected to a corresponding bit lines, and to a common write node 2728 by an access devices (one shown as 2716).

It is understood that each of bit lines 2704-0/1 may be connected to multiple memory cells.

Figure 28:
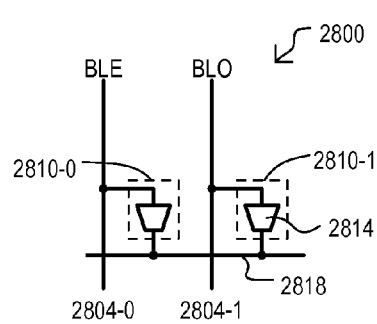

FIG. 28 shows an arrangement like that of FIG. 25. However, programmable impedance elements (one shown as 2814) may particularly be PMCs having anodes connected to bit lines 2804-0/1 and cathodes connected to a write node 2818.

Figure 29:
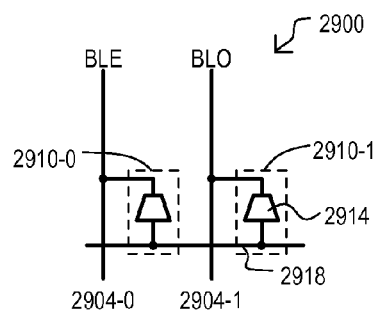

FIG. 29 shows an arrangement like that of FIG. 28. However, PMCs (one shown as 2914) may have cathodes connected to bit lines 2904-0/1 and anodes connected to a write node 2928.

Figure 30:
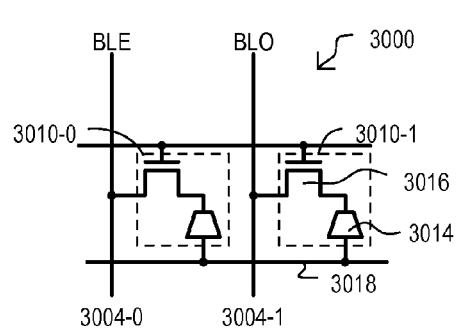

FIG. 30 shows an arrangement like that of FIG. 26. However, access devices (one shown as 3016) may be transistors, and in the particular example shown, n-channel transistors. Further, programmable impedance elements may include PMCs (one shown as 3014), having cathodes connected to bit lines 3004-0/1 with access devices, and anodes connected to a write node 3018. Alternate embodiments may include different conductivity type transistors and/or transistors that connect anodes of PMCs to corresponding bit lines.

Figure 31:
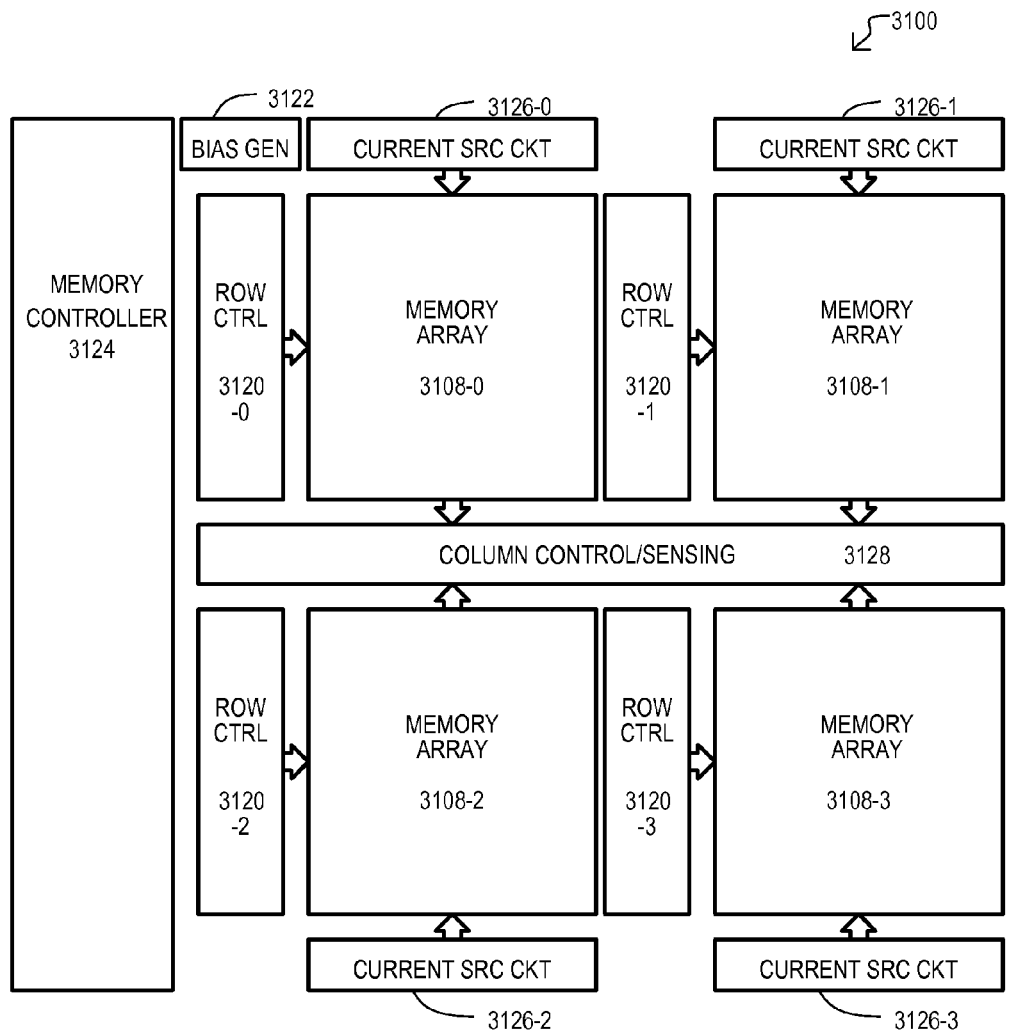
FIG. 31 is a plan view of an integrated circuit according to an embodiment.

FIG. 31 shows an integrated circuit 3100 according to an embodiment. Integrated circuit 3100 may include memory arrays 3108-0-3, row control circuits 3120-0-3, a bias generator 3122, a memory controller 3124, current source circuits 3126-0-3, and a column control and sensing circuits 3128.

Memory arrays 3108-0-3 may include memory cells arranged in rows and columns. Memory arrays 3108-0-3 may include programmable impedance elements, and in particular embodiments, may have a structure like that shown in any of FIGS. 25 to 30, or equivalents. Memory arrays 3108-0-3 may have bit lines arranged into groups, where bits lines of each group may be switched to particular voltages together. Alternatively, each such group may be connected, directly or indirectly, to a bit line group node.

Row control circuits 3120-0-3 enable access to rows of memory cells within memory arrays 3108-0-3. In particular embodiments, this may include driving word lines that enable access devices within memory cells. In other embodiments, this may include driving write lines common to memory cells of a row (e.g., lines connected directly to programmable impedance elements of a row).

A bias generator 3122 may provide control signals and bias voltages to current source circuits 3126-0-3, and may be controlled by memory controller 3124.

Current source circuits 3126-0-3 may be connected to bit lines or bit line group nodes within corresponding memory arrays 3128-0-3, to enable the bit lines within such groups to be driven to a common bias voltage, substantially simultaneously, or present a high impedance to such bit lines. Current source circuits 3126-0-3 may take the form of the various current source circuits shown herein, or equivalents.

Column control and sensing circuits 3128 may sense currents flowing through bit lines of memory arrays 3128-0-3, and generate data values corresponding to such current values. In a very particular embodiment, current values may be translated into binary data values, being a "0" if a less than a reference current, or "1" if greater than reference current. Column control and sensing circuits 3128 may provide sensed data values to memory controller 3124. In one particular embodiment, current values may be translated into binary data values, being one value (e.g., "1") if a change in current occurs during a read operation, or another value (e.g., "0") if a change in current does not occur during a read operation. In another particular embodiment, a one data value (e.g., "0") may be generated if a current is less than a reference current, or another data value (e.g., "1") if a current is greater than reference current. Column control and sensing circuits 3128 may provide sensed data values to memory controller 3124.

A memory controller 3124 may generate signals for controlling bias generator 3122, row control circuits 3120-0-3, and column control and sensing circuit 3128. In particular, a memory controller 3124 may generate control signals that cause bias generator 3122 to drive groups of bit lines within memory arrays 3128-0-3 to particular bias voltages by operation of current source circuits 3126-0-3, or place current source circuits 3126-0-3 into a high impedance state. In addition, memory controller 3124 may generate control signals that cause row control circuits 3120-0-3 to access rows in a predetermined order. This may enable automatic writing of data to a sequence of rows. Memory controller 3124 may further generate signals to select particular bit lines (e.g., columns) within memory arrays 3128-0-3 for current sensing. Memory controller 3124 may also receive sensed data values output by column control/sensing circuit 3128 for comparison with expected data values.

It is understood that a memory controller 3124 may be formed in a same integrated circuit package as the other integrated circuit blocks shown in FIG. 31. In a particular embodiment, all blocks of FIG. 31 may be formed in a same integrated circuit substrate.

Figure 32:
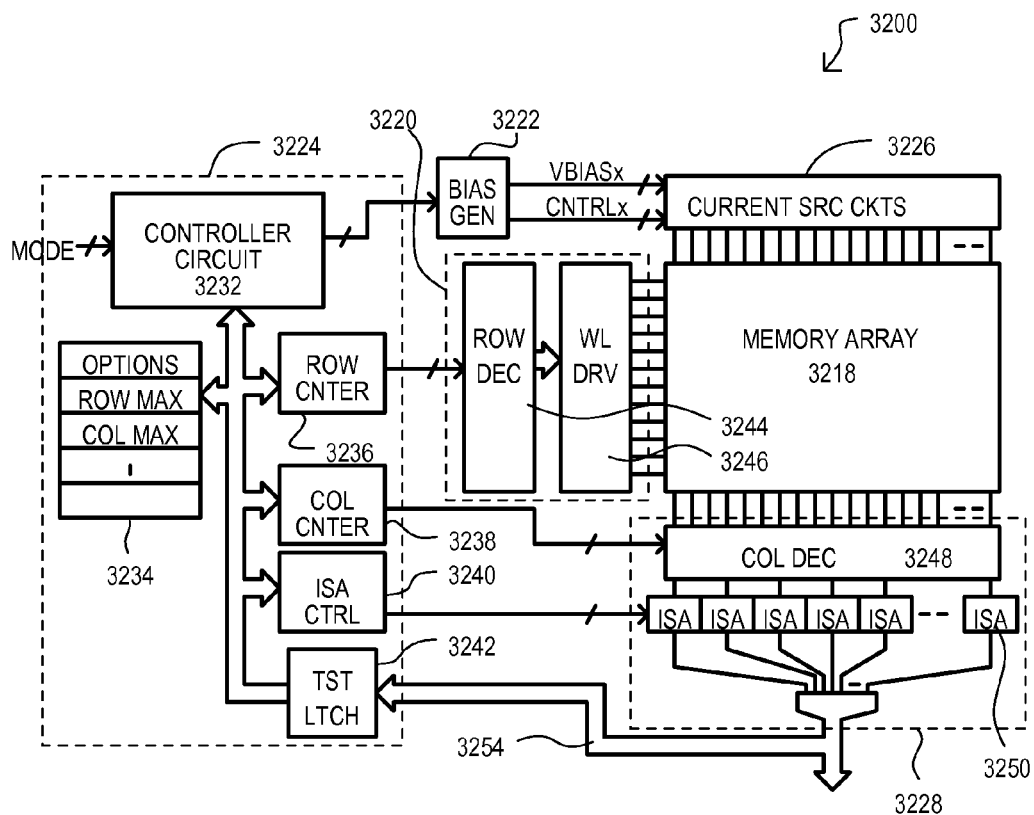
FIG. 32 is a block schematic diagram of a memory device according to an embodiment.

FIG. 32 shows one example of an integrated circuit 3200 according to another embodiment. In one arrangement, integrated circuit 3200 may one example of a portion of that shown in FIG. 31, in which case like sections are referred to by the same reference character but with the first digits being "32" instead of "31".

In the embodiment of FIG. 32, a memory controller 3224 may include a controller circuit 3232, a configuration store 3234, a row counter 3236, a column counter 3238, a current sense amplifier (sense amp) control circuit 3240, and a test latch 3242. In response to mode information (MODE), a controller circuit 3232 may generate control signals for bias generator 3222, row counter 3236, column counter 3238, and current sense amp control circuit 3240. In addition, controller circuit 3232 may receive data values from configuration store 3234 as well as test data from test latch 3242. In very particular embodiments, a controller circuit 3232 may include a microcontroller circuit that may execute predetermined instructions stored in a memory, such as firmware stored in a nonvolatile memory.

A configuration store 3234 may provide various data values to controller circuit 3232. In the embodiment of FIG. 32, configuration store 3234 may include option data (OPTIONS), a maximum row value (ROW MAX), and a maximum column value (COL MAX). An OPTIONS value may determine how a controller circuit 3232 controls bias generator 3222, and hence, how current source circuits 3226 operate. As but a few examples, and as will be shown in more detail below, OPTIONS data may determine a type of test pattern written into a memory array 3228. A ROW MAX value may determine where a sequence of row accesses may stop. Similarly, a COL MAX value may determine where a sequence of column accesses stops.

In response to control signals from controller circuit 3232, row counter 3236 may be reset to a starting row value, and execute a row counting operation that increments a row access value (e.g., row address). Similarly, in response to control signals from controller circuit 3232, column counter 3240 may be reset to a starting column value, and execute a column counting operation that increments a column access value (e.g., column address).

A test latch 3242 may receive test data values from a column control/sense circuit 3228, and provide such values to controller circuit 3232 and/or allow such values to be read by a controller circuit 3232.

Bias generator 3222 may generate control signals (CTRLx) and bias values (VBIASx) for current source circuits 3226 in response to control signals from controller circuit 3232. Current source circuits 3226 may provide current source circuits for bit lines or groups of bit lines, to thereby enable groups of bit lines to be driven to bias voltages, relatively rapidly, and substantially simultaneously. In particular embodiments, current source circuits 3226 may include structures of those current source circuits shown in the various embodiments herein, or equivalents.

In the embodiment of FIG. 32, row control circuit 3220 may include a row decoder 3244 and a word line driver 3246. A row decoder 3244 may receive a row value from row counter 3236, and decode such a value to generate one or more word line activation signals. In response to word line activation signals, a word line driver 3246 may activate one or more rows of memory array 3218. Depending upon the architecture of memory array 3218, activation of a row may include activating a word line to enable access devices within memory cells and/or driving a line commonly connected to terminals of programmable impedance devices of a same row (e.g., commonly driving anodes or cathodes of PMCs in a row).

In the particular embodiment shown, a column control and sense circuit 3228 may include a column decoder 3248 and current sense amplifiers (one shown as 3250). Column decoder 3248 may receive a column value from column counter 3238, and decode such a value to enable signal paths between selected bit lines and current sense amplifiers (e.g., 3250). Current sense amplifiers (e.g., 3250) may sense a current flowing through selected bit lines, and generate data values from such a sensing operation. Such data values may be supplied to test latch 3242 by a data bus 3254.

Figure 33A:
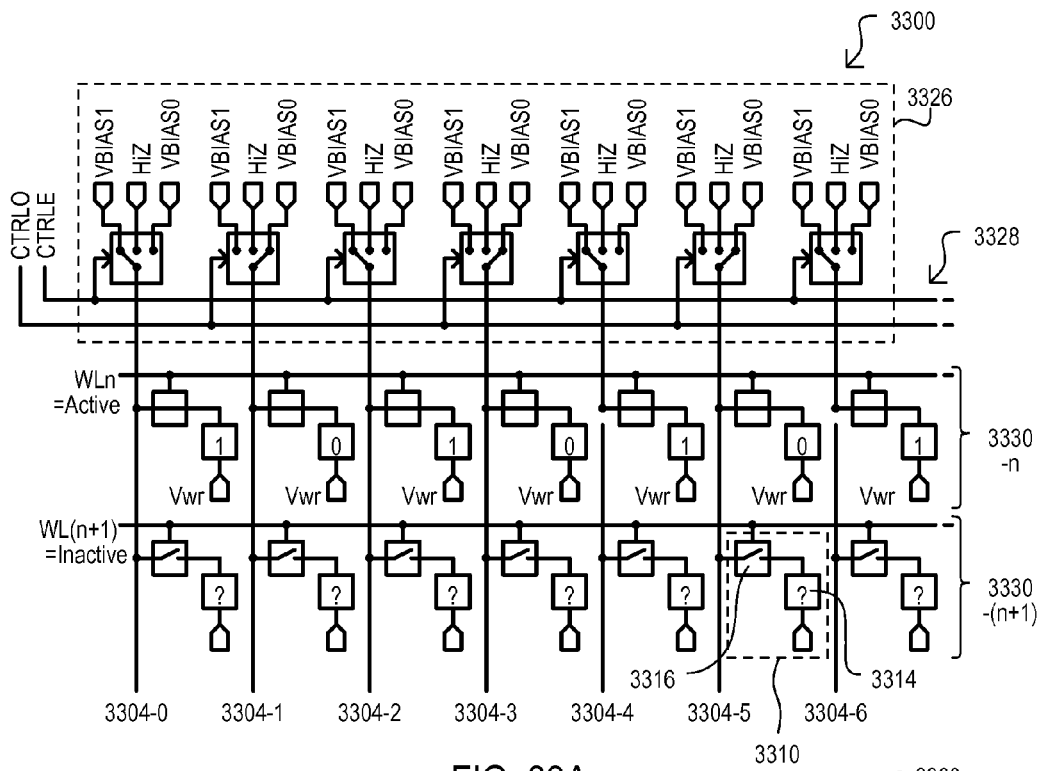
FIGS. 33A and 33B are schematic diagrams showing write operations according to embodiments.
Figure 33B:
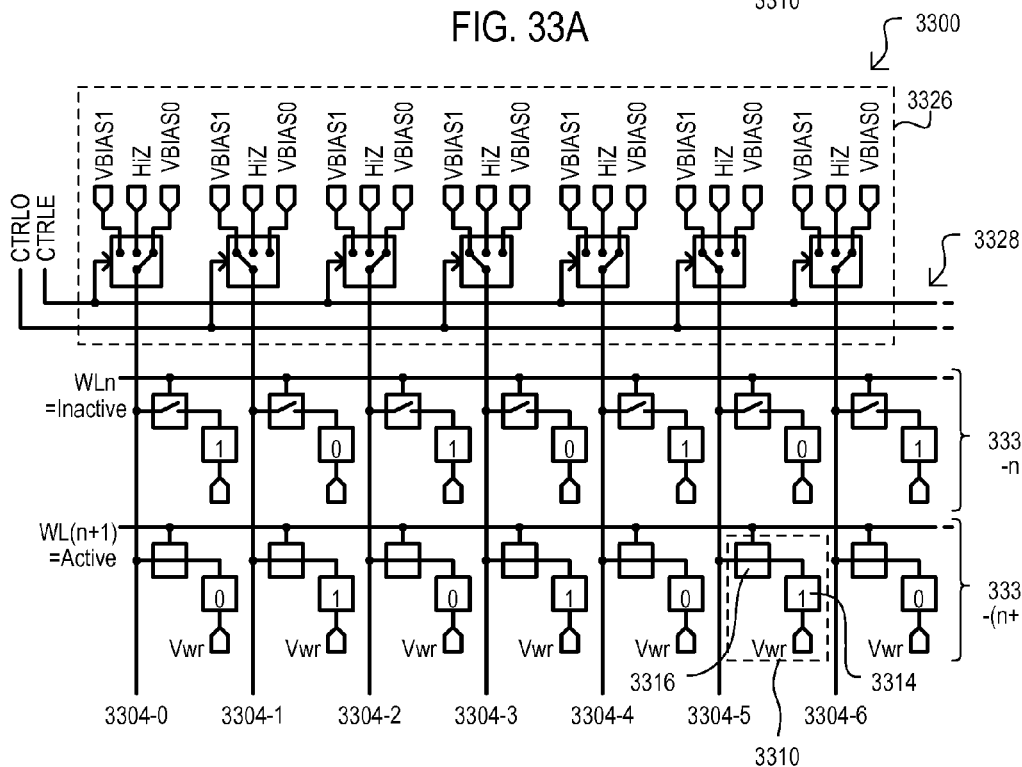

FIGS. 33A and 33B show a write operation of a memory device 3300 according to an embodiment. The particular write operation shown may write a "checkerboard" pattern into memory cells.

The memory device 3300 may include a memory array 3328 and current source circuits 3326. Memory array 3328 may have memory cells (one show as 3310) that each includes an access device 3316 and a programmable impedance element 3314. Memory cells may be arranged into rows and columns, with memory cells of the same column being connected to a same bit line 3304-0-6, and memory cells of a same row being connected to a same word line (two shown as WLn, WL(n+1)). FIGS. 33A and 33B show two rows 3330-$n/n+1$. It is assumed that writing a "1" to a memory cell involves the application of a voltage VBIAS1–Vwr across a programmable impedance element, while a writing of a "0" involves the application of a voltage VBIAS0–Vwr across a programmable impedance element.

Current source circuits 3326 may include even current source circuits that connect even bit lines (3304-0,2 . . . ) to a first bias voltage VBIAS1, a second bias voltage VBIAS0, or present a high impedance to such bit lines. Similarly, current source circuits may include odd current source circuits that connect odd bit lines (3304-1,3 . . . ) to a first bias voltage VBIAS1, a second bias voltage VBIAS0, or present a high impedance to such bit lines.

FIG. 33A shows a writing operation that writes alternating data values to columns of a first row 3330-$n$. Even current source circuits may drive even bit lines (3304-0,2 . . . ) to a voltage VBIAS1. Odd current source circuits may drive odd bit lines (3304-1,3 . . . ) to a voltage VBIAS0. Terminals of programmable impedance elements opposite to the access devices may be driven to a write voltage Vwr. In very particular embodiments, such terminals of all programmable impedance elements may be driven at Vwr in the write operation shown.

A word line WLn may be active, enabling access devices of row 3330-$n$, resulting in write voltages VBIAS0 and VBIAS1 being applied to programmable impedance elements of odd and even rows, respectively. As a result, an alternating pattern of data values 1, 0, 1, 0 . . . may be written into row 3330-*n*. Once a write operation is complete, a word line WLn may return to an inactive level.

FIG. 33B shows a writing operation that writes alternating data values to columns of a second row 3330-*n*+1 that have the reverse pattern to that of a first row 3330-*n*. Even current source circuits may drive even bit lines (3304-0,2 . . . ) to a voltage VBIAS0 and odd current source circuits may drive odd bit lines (3304-1,3 . . . ) to a voltage VBIAS1. Word line WLn+1 may be active, enabling access devices of row 3330-*n*+1, resulting in write voltages VBIAS0 and VBIAS1 being applied to programmable impedance elements of even and odd columns, respectively. As a result, an alternating pattern of data values 0, 1, 0, 1 . . . may be written into row 3330-*n*+1. Once a write operation is complete, a word line WLn+1 may return to an inactive level.

Write processes like that of FIGS. 33A and 33B may be repeated to sequential rows, to write a "checkerboard" pattern into memory array 3328. Alternatively, multiple even rows may be written with one pattern, and multiple odd rows may be written with the reverse pattern.

Figure 34:
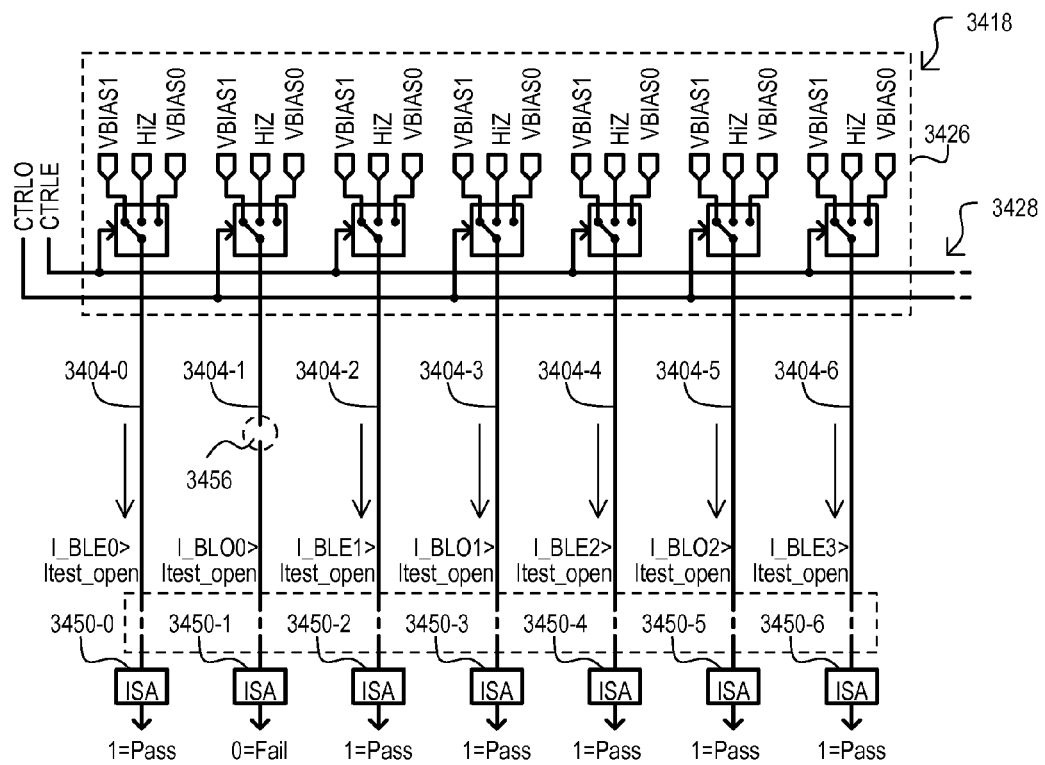
FIGS. 34 and 35 are schematic diagrams showing test operations according to embodiments.

FIG. 34 shows a test operation of a memory device 3400 according to an embodiment. The particular test operation shown may test bit lines to determine if any of such bit lines have an undesirably high impedance.

The memory device 3400 may include a memory array 3428, current source circuits 3426, and current sense amplifiers 3450-0-6. Memory array 3428 may have bit lines 3404-0-6 arranged into even and odd groups.

Current source circuits 3426 may connect bit lines to a first bias voltage VBIAS1, second bias voltage VBIAS0, or present a high impedance.

Current sense amplifiers 3450-0-6 may generate data values by sensing a current flowing through a corresponding bit line. In the particular example shown, current sense amplifiers 3450-0-6 may compare a bit line current to a test current Itest_open. In one embodiment, if a bit line current is greater than Itest_open, a current sense amplifier 3450-0-6 may output a value "1". If a bit line current is less than Itest_open, a current sense amplifier 3450-0-6 may output a value "0". It is understood that current sense amplifiers 3450-0-6 may be connected directly to corresponding bit lines 3404-0-6, or by way of intervening circuits (e.g., column select/decoder circuits).

FIG. 34 shows a test operation that drives bit lines 3404-0-6 to a bias voltage VBIAS1. It is understood that current sense amplifiers 3450-0-6 may bias bit lines to create a potential drop across the bit lines (with respect to applied bias voltage VBIAS1). In the particular example shown, current sense amplifiers 3450-0-6 may be at a lower potential than VBIAS1, resulting in a current flow toward the sense amplifiers 3450-0-6. However, in an alternate embodiment, current sense amplifiers may be at a higher potential than a bias potential (e.g., VBIAS0) resulting in a current flow away from the sense amplifiers 3450-0-6.

Under such bias conditions, provided a bit line presents a low enough resistance, a current flowing through a bit line may be greater than a reference current Itest_open. In the example of FIG. 34, it is assumed that bit line 3404-1 includes a defect 3456 that results in an undesirably high resistance (e.g., an open). Consequently, a current flowing through bit line 3404-1 (I_BL00) may be less than Itest_open. Thus, current sense amplifier 3450-1 outputs a value "0", indicating a defect.

Figure 35:
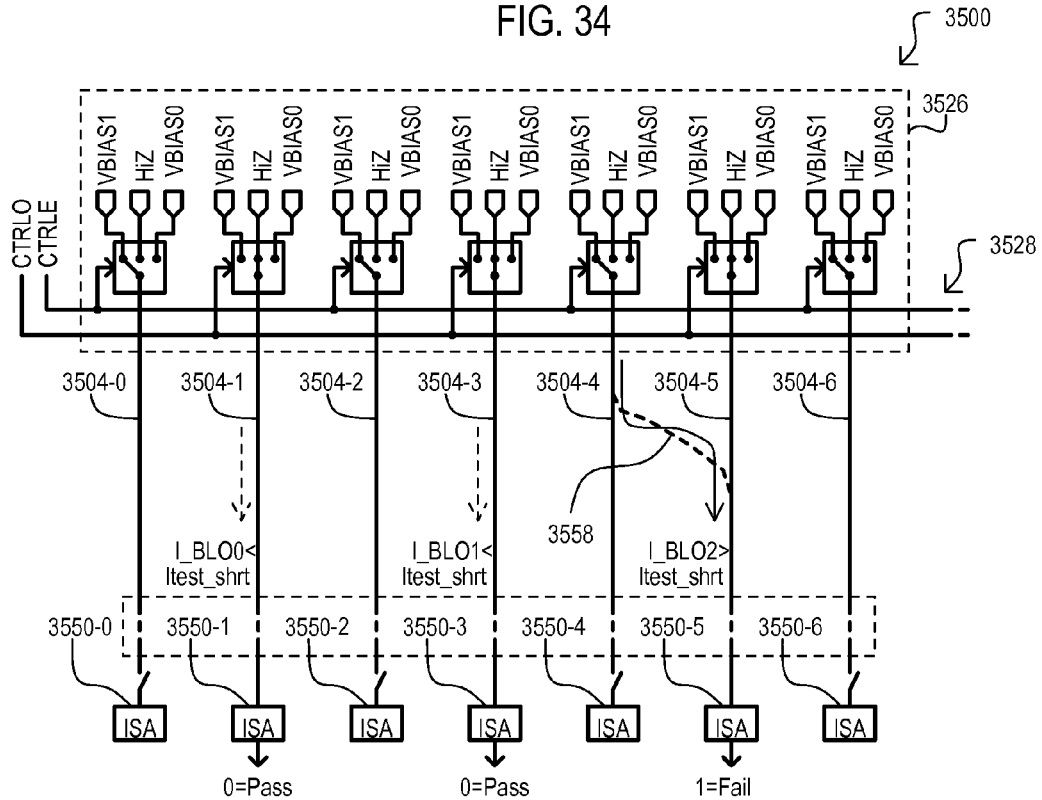

FIG. 35 shows a test operation of a memory device 3500 according to an embodiment. The particular test operation shown may test bit lines to determine if current leakage paths exist between adjacent bit lines.

The memory device 3500 may include a memory array 3528, current source circuits 3526, and current sense amplifiers 3550-0-6. Memory array 3528 may have bit lines 3504-0-6 arranged into even and odd groups.

Current source circuits 3526 may connect bit lines to a first bias voltage VBIAS1, second bias voltage VBIAS0, or present a high impedance.

Current sense amplifiers 3550-0-6 may generate data values by sensing a current flowing through a corresponding bit line. In the particular example shown, current sense amplifiers 3550-0-6 may compare a bit line current to a test current Itest_shrt. If a bit line current is greater than Itest_shrt, a current sense amplifier 3550-0-6 may output a value "1". If a bit line current is less than Itest_shrt, a current sense amplifier 3550-0-6 may output a value "0". It is understood that current sense amplifiers 3550-0-6 may be connected directly to corresponding bit lines 3504-0-6, or by way of intervening circuits (e.g., column select/decoder circuits).

FIG. 35 shows a test operation that drives even bit lines to a bias voltage (in this example VBIAS1), while a high impedance is presented to odd bit lines. Further, current sense amplifiers 3550-0,2 . . . corresponding to biased bit lines may be disconnected from their corresponding bit lines.

It is understood that those current sense amplifiers 3550-1,3 . . . still connected to bit lines may bias bit lines to a potential different than the bias voltage applied to the other bit line group (VBIAS1). In the particular example shown, current sense amplifiers 3550-1,3 . . . may be at a lower potential than VBIAS1. However, in an alternate embodiment, such current sense amplifiers may be at a higher potential than bias voltage (e.g. VBIAS0).

Under such bias conditions, provided no current leakage path exists between adjacent bit lines, little or no current may flow through the sensed bit lines (odd bit lines in this case). In the example of FIG. 35, it is assumed that a defect 3558 exists between bit lines 3504-4 and 3504-5 that results in current flowing from biased bit line 3504-4 through bit line 3504-5 that is sensed by current sense amplifier 3550-5. Accordingly, a current flowing through bit line 3504-5 (I_BLO2) may be greater than Itest_shrt. Thus, current sense amplifier 3550-1 outputs a value "1", indicating a defect.

Figure 36:
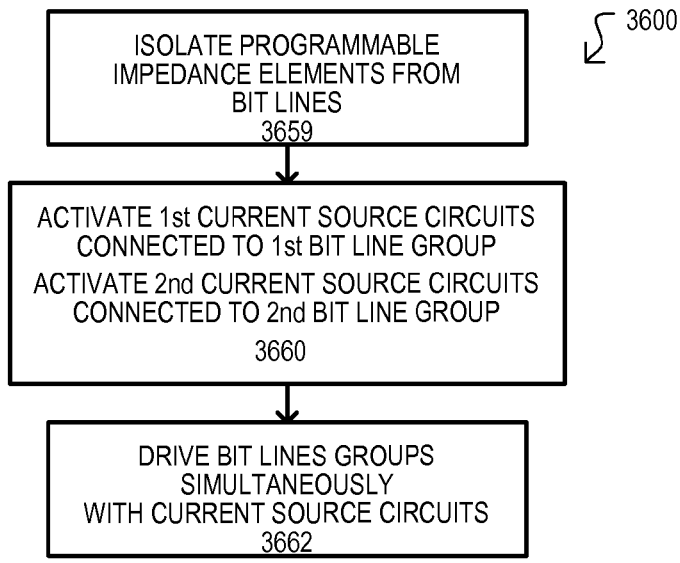
FIG. 36 is a flow diagram of a bit line driving method according to an embodiment.

FIG. 36 shows a method 3600 according to an embodiment. A method 3600 may include isolating programmable impedance elements from bit lines (3659). Programmable impedance elements may be programmable between at least two impedance states as described above in other embodiments (e.g., static or dynamic response). Isolating such elements may include placing access devices of memory cells into high impedance state.

A method 3600 may also include activating first current source circuits connected to a first bit line group and activating second current source circuits connected to a second bit line group (3660). Such an action may include enabling current source circuits to apply particular bias voltages.

A method 3600 may also include driving bit line groups simultaneously with current source circuits (3662). Such an action may include driving bit line groups together to write test data into a memory array, or test a memory array for column defects, including undesirably high bit line impedance (e.g., bit line opens) and/or undesirably large leakage between bit lines (e.g., bit line shorts).

Figure 37:
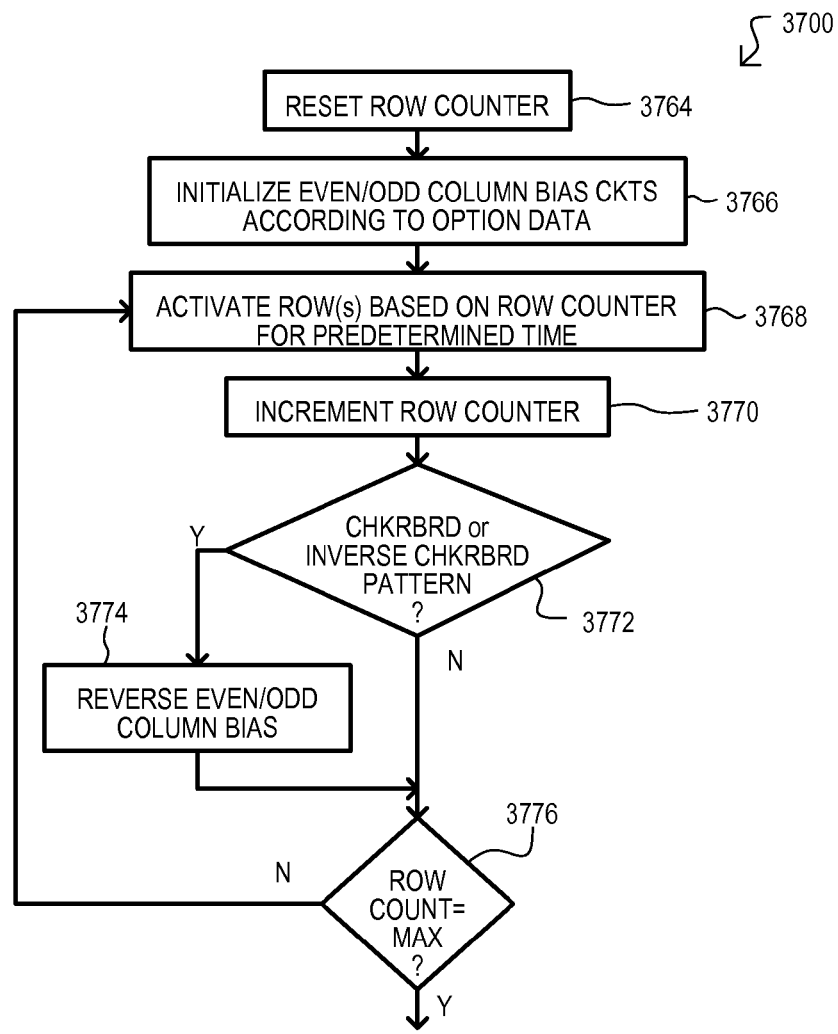
FIG. 37 is a flow diagram of an array access method according to an embodiment.

FIG. 37 shows a method 3700 according to another embodiment. A method 3700 may include resetting a row counter (3764). In particular embodiments, such an action may include controlling a row counter to output a start row location for a test write operation. A method 3700 may further include initializing even/odd column bias circuits according to option data (3766). Such an action may include configuring column bias circuits connected to bit lines. In particular embodiments, this may include driving bit line groups to a same bias voltage, driving bit line groups to different bias voltage, driving one bit line group to a bias voltage while presenting a high impedance to another, or various combinations thereof. In very particular embodiments, such configuring steps may dictate a test pattern written into a memory array (e.g., checkerboard, reverse checkerboard). Column bias circuit may include current source circuits shown in embodiments above, or equivalents.

A method 3700 may further include activating row(s) indicated by row counter for a predetermined time (3768). Such an action may enable data values to be written into one or more rows based on column bias circuits. In some embodiments, data may be written to a single row. However, in alternate embodiments data may be written to multiple rows substantially simultaneously.

A method 3700 may also include incrementing a row counter (3770). Such action may advance to a next row value in a sequence. In particular embodiments, where data is written to one row at a time, a row value may be incremented by one. However, in other embodiments, where data is written to multiple rows, a row value may be incremented by values greater than one.

The particular method 3700 of FIG. 37 includes determining if a method is writing a checkerboard pattern or reverse checkerboard pattern (3772). If a checkerboard pattern is being written (Y from 3774), column biases may be reversed (3774) to ensure next row is written with the opposite pattern as the previous row.

If a checkerboard/reverse checkerboard pattern is not being written (N from 3774), or biases are reversed, a method 3700 may include determining if a maximum row value has been reached (3776). If a maximum row value has not been reached (N from 3776), a method may return to step 3768. If a maximum row value has been reached (Y from 3776), a method may be complete.

It is understood that in particular embodiments, a method like that of FIG. 37 may be executed by devices shown in FIGS. 31 and/or 32 to perform a write operation like that shown in FIGS. 33A/B.

Figure 38:
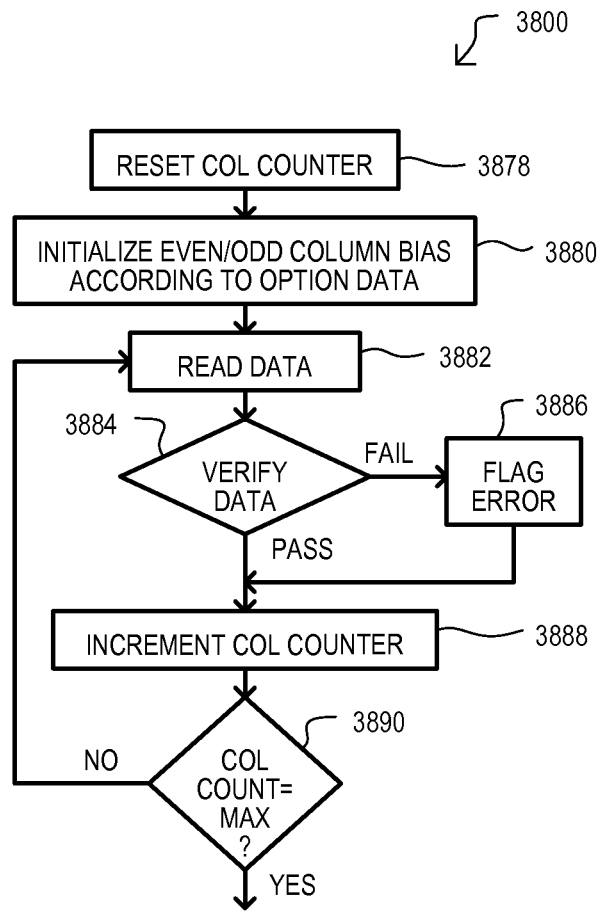
FIG. 38 is a flow diagram of a test method according to an embodiment.

FIG. 38 shows a further method 3800 according to another embodiment. A method 3800 may include resetting a column counter (3878). In particular embodiments, such an action may include controlling a column counter to output a start column location for a test operation.

A method 3800 may further include initializing even/odd column bias circuits according to option data (3880). Such an action may include configuring column bias circuits connected to bit lines. In particular embodiments, this may include driving all bit line groups to a same bias voltage, driving bit line groups to different bias voltage, driving one bit line group to a bias voltage while presenting a high impedance to another bit line group, or various combinations thereof. In very particular embodiments, such configuring steps may determine a type of test operation. For example, such steps may configure column bias circuits for a test that checks for high bit line resistance (e.g., bit line open test) by driving all bit lines groups to a same bias voltage. However, for a test that checks for leakage between bit lines, one bit line group may be driven to a bias voltage, while a high impedance is presented by another other column bias circuit. Column bias circuit may include current source circuits shown in embodiments herein, or equivalents.

A method 3800 may further include reading data 3882. Such an action may include sensing a current flowing through all or selected bit lines. In some embodiments, this may include current sensing to generate a binary value.

Read data may then be verified 3884. Such an action may include comparing read data values with expected data values. In particular embodiments, this may include looking for a particular value to indicate a failure location. As but two very particular examples, such an action may include looking for a binary value (e.g., 0) indicating lack of sufficient current through a bit lines, or looking for a binary value (e.g., 1) indicating excessive current flowing through a bit line that may originate from an adjacent bit line. If read data fails verification (FAIL from 3884), an error may be flagged 3886.

A method 3800 may also include incrementing a column counter (3888). Such action may advance to a next group of columns (e.g., bit lines) from which to read data.

The particular method 3800 of FIG. 38 further includes determining if a maximum column value has been reached (3890). If a maximum column value has not been reached (N from 3890), a method may return to step 3882. If a maximum column value has been reached (Y from 3890), a method may be complete.

It is understood that in particular embodiments, a method like that of FIG. 38 may be executed by devices shown in FIGS. 31 and/or 32 to perform test operation like that shown in FIG. 34 and/or 35.

Having described embodiments with temperature varying write operations to memory elements, additional embodiments showing the generation of a bias circuit that may track a common voltage will now be described. It is understood that such embodiments may include temperature varying write circuits, as well as bit line writing and testing methods as described above.

Figures 39, 40:
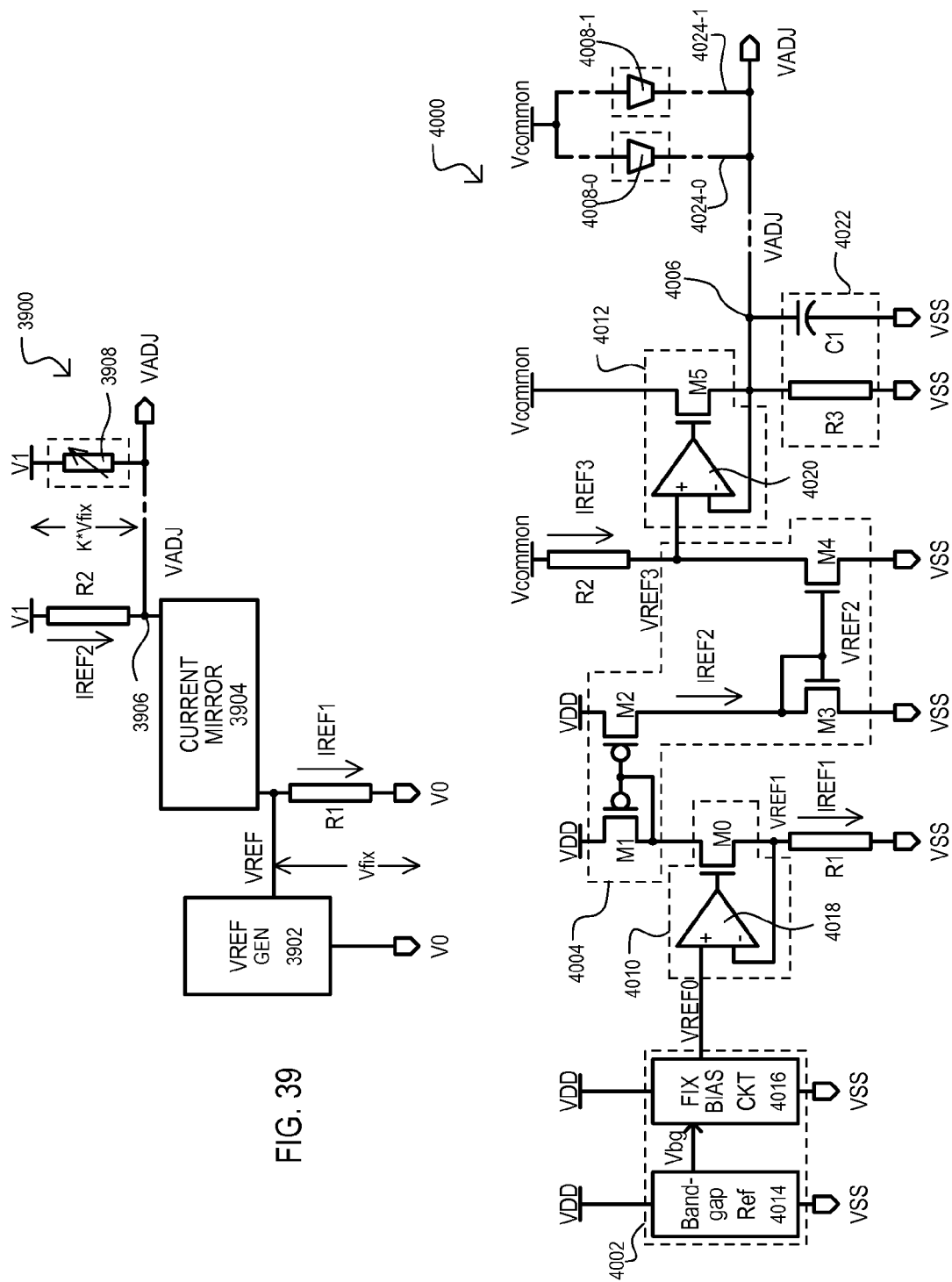
FIG. 39 is a block schematic diagram of a bias circuit according to an embodiment.
FIG. 40 is a block schematic diagram of a bias circuit according to another embodiment.

FIG. 39 shows a bias circuit 3900 according to one embodiment that includes a reference circuit 3902, a first resistance R1, a current mirror circuit 3904, and a second resistance R2. A bias circuit 3900 may generate a reference voltage VREF, and in response, provide an adjustable voltage VADJ at an output node 3906. An adjustable voltage VADJ may be applied to a programmable impedance element 3908. A programmable impedance element may be programmed (i.e., written) to store two or more impedance states. Different impedance states may include both static impedance responses and dynamic impedance responses. A static read impedance responses may include memory elements maintaining substantially a same impedance before and after read (i.e., sensing) operations. In contrast, a dynamic read response may include inducing a change in memory element impedance during a read operation.

A reference circuit 3902 may generate a reference voltage VREF based on at least two supply voltages, one shown as V0. In the embodiment shown, a difference between reference voltage VREF and supply voltage V0 may be a fixed voltage Vfix. This may be true over substantially the entire normal operating conditions of the bias circuit 3900. In one very particular arrangement, a voltage VREF may be substantially temperature independent, maintaining a difference Vfix with respect to V0 over the normal operation temperature range of bias circuit 3900.

A first resistance R1 may receive a reference voltage VREF and a second voltage, in this particular example V0, to generate a first reference current IREF1.

A current mirror circuit 3904 may mirror first reference current IREF1 to generate a second reference current IREF2. Such a mirroring may result in second reference current IREF2 tracking first reference current IREF1. That is, if different bias conditions and/or manufacturing variations result in first reference current IREF1 being larger or smaller, IREF2 will be correspondingly larger or smaller. In one embodiment, current mirroring will result in current IREF1 substantially matching current IREF2. However, in an alternate embodiment, current IREF2 may be a scaled version of IREF1. For example, IREF2=M*IREF1, where M is real number.

A second resistance R2 may have one terminal connected to output node 3906 and another terminal connected to a voltage V1. In addition, current IREF2 may be drawn through second resistance R2 to create a voltage difference between output node 3906 and voltage V1 to produce adjustable voltage VADJ at output node 3906. In the embodiment shown, a difference between reference voltage V1 and voltage VADJ may be a fixed voltage K*Vfix, where K is real number and Vfix is the input voltage difference between VREF and V0. In this way, a voltage VADJ may be a fixed voltage with respect of V1. In one embodiment, a scaling factor K may be one. Even more particularly, a resistance R1 may be the same as resistance R2 and a current mirror circuit 3904 may provide a matching mirroring (e.g., IREF1 matches IREF2). However, in alternate embodiments, a scaling factor may be other than one, by having resistance R1 be different from R2, having current mirror provide a scaled mirroring (i.e., IREF2=M*IREF1, where M is not one), or some combination thereof.

A voltage V1 and VADJ may be applied across terminals of a programmable impedance element 3908. Such voltage may be applied directly or by way of intervening circuits (not shown). The application of such voltages may allow operations to be performed on element 3908 with an established voltage difference (e.g., K*VFIX) with respect to voltage V1. As but two examples, such a voltage may be applied in a read operation to generate a read current from element 3908 or to write data to an element 3908 (i.e., alter an impedance of the element).

FIG. 40 shows a bias circuit 4000 according to another embodiment. A bias circuit 4000 may include a reference circuit 4002, current mirror circuit 4004, output node 4006, an input amplifier circuit 4010, an output amplifier circuit 4012, and programmable impedance elements (two shown as 4008-0 and 4008-1). In addition, a bias circuit 4000 may include a first resistance R1, second resistance R2, and third resistance R3.

In one very particular arrangement, a bias circuit 4000 may be one example of that shown in FIG. 39.

In the very particular embodiment shown, a reference circuit 4002 may include a band gap reference circuit 4014 and a fixed bias circuit 4016. A band gap reference circuit 4014 may be connected between a high power supply voltage node VDD and a low power supply voltage node VSS. A band gap reference circuit 4014 may generate a band gap voltage (Vbg) by generating a proportional to absolute temperature (PTAT) component and a complementary to absolute temperature (CTAT) component generated by a p-n junction current. Such components may be used to offset one another to provide a substantially temperature independent current. Such a current may be used to generate Vbg.

A fix bias circuit 4016 may be connected between supply voltage node VDD and node VSS, and receive a band gap voltage Vbg. In response to the band gap voltage Vbg, fix bias circuit 4016 may generate a reference voltage VREF0. In one particular embodiment, a fix bias circuit 4016 may be a voltage scaling circuit that scales a band gap voltage Vbg to generate reference voltage VREF0 (e.g., VREF0=N*Vbg, where N is real number). A reference voltage VREF0 may have a fixed difference with respect to a low power supply voltage node VSS. In one very particular embodiment, a difference between VREF0 and node VSS may be first fixed voltage VFIX1.

An input amplifier circuit 4010 may amplify a reference voltage VREF0 to generate an input reference voltage VREF1 for first resistance R1. It is understood that while amplification may include increasing voltage amplitude, in the particular embodiment of FIG. 40, amplification may include amplifying a driving capability. That is, input amplifier circuit 4010 may have a unity gain configuration (i.e., may be a unity gain buffer). In the very particular example shown, an input amplifier circuit 4010 may include a first amplifier 4018 that drives a source follower device M0. First amplifier 4018 may particularly be an operational amplifier (op amp) and source follower device M0 may be an n-channel transistor. First amplifier 4018 may have a (+) input connected to receive reference voltage VREF0, an output connected to a gate of M0, and a (−) input connected to a source of M0. Transistor M0 may have a source-drain path connected between current mirror circuit 4004 and first resistance R1, to provide a voltage VREF1 at its source. In such an arrangement, amplifier circuit 4010 may drive transistor M0 to maintain a voltage VREF1 at a source of transistor M0 (i.e., VREF1 matches VREF0).

First resistance R1 may have voltage VREF1 applied to a first terminal and a have a second terminal connected to power supply voltage node VSS. In operation, such an arrangement may generate a first reference current IREF1 through first resistance R1.

Current mirror circuit 4004 may include a first current mirror M1/M2 and a second current mirror M3/M4. In particular, first current mirror M1/M2 may include p-channel transistors M1 and M2. Transistor M1 may have a source-drain path connected between a power supply node VDD and a drain of transistor M0, and have its gate connected to its drain. Transistor M2 may have a source connected to power supply node VDD and a gate connected to a gate of transistor M1. A second current mirror M3/M4 may include n-channel transistors M3 and M4. Transistor M3 may have a source-drain path connected between a drain of transistor M2 and a power supply node VSS, and a gate connected to its drain. Transistor M4 may have a source connected to power supply node VSS and a gate connected to a gate of transistor M3.

In such a configuration, a current IREF1 drawn through transistor M1 may be mirrored by transistor M2 to generate a second reference current IREF2. Reference current IREF2 drawn through transistor M3 may be mirrored by transistor M4 to draw a reference current IREF3.

It is understood that transistor M1 and M2 may be matching transistors fabricated with the same manufacturing process. Similarly, transistors M3 and M4 may be matching transistors in the same way. In one very particular embodiment, transistor M1 may also match transistor M2 in size (transistor width and length), and transistor M3 may match transistor M4 in size. In such an arrangement, current IREF1 may match IREF2, which may match IREF3. However in alternate embodiments, transistor M2 may differ in size from M1 and/or transistor M3 may differ in size from transistor M4 to provide current scaling (e.g., IREF2=H*IREF1, IREF3=J*IREF2, where H and J are real numbers).

Second resistance R2 may have a first terminal connected to a common node Vcommon and a second terminal connected to current mirror circuit 4004. By operation of current mirror circuit 4004 a current IREF3 may be drawn through resistance R2, creating a voltage drop with respect to node Vcommon.

In one very particular embodiment in which resistance R1 matches R2, and current mirror circuit 4004 has same size mirrored pairs, a resulting voltage difference between node Vcommon and VREF3 may match that between VREF0 and VSS. In such an arrangement, voltage VREF3 may be considered to adjust with changes in Vcommon. That is, assuming a difference between VREF0 and VSS is VFIX, if Vcommon is higher in a particular application, VREF3 may be correspondingly higher to maintain a VFIX difference. Conversely, if Vcommon is lower in an application, VREF3 may be correspondingly lower.

An output amplifier circuit 4020 may amplify a reference voltage VREF3 to generate an output voltage VADJ on output node 4006. As in the case of input amplifier circuit 4010, an amplification by output amplifier circuit 4012 may include increasing voltage amplitude, but in the particular embodiment of FIG. 40, may amplify a driving capability and have a unity gain configuration. In the very particular example shown, an output amplifier circuit 4012 may include a second amplifier 4020 that drives a source follower device M5. Second amplifier 4020 may particularly be an op amp, and source follower device M5 may be an n-channel transistor M5. Second amplifier 4020 may have a (+) input connected to receive reference voltage VREF3, an output connected to a gate of M5, and a (−) input connected to a source of M5. Transistor M5 may have a source-drain path connected between node Vcommon and output node 4006, to provide a voltage VADJ at its source. In such an arrangement, amplifier circuit 4012 may drive transistor M5 to maintain a voltage VREF3 at a source of transistor M5 (i.e., VADJ matches VREF3).

A load 4022 may be connected between output node 4006 and power supply node VSS. In the particular example of FIG. 40, load 4022 may include a resistance R3 and a capacitance C1.

Referring still to FIG. 40, programmable impedance elements 4008-0 and 4008-1 may have first nodes connected to a node Vcommon and second nodes connected to receive voltage VADJ. Connections between elements 4008-0/1) and such nodes/voltages may be direct or indirect. In the particular embodiment of FIG. 40, programmable impedance elements 4008-0/1 may be PMCs having anodes commonly connected to node Vcommon, and cathodes connected to VADJ via separate bit lines 4024-0 and 4024-1, respectively. However, in alternate embodiments, elements (4008-0/1) may have a dynamic impedance response during a read operation, rather than a static response as the case of PMCs.

In such an arrangement, a fixed voltage (voltage at Vcommon−VADJ) may be applied across elements 4008-0/1. Such a fixed voltage may provide a consistent read voltage across elements 4008-0/1, despite variations in a voltage at Vcommon, to generate read currents for determining a data state stored by the elements 4008-0/1. Alternatively, such a fixed voltage may provide a consistent write voltage across elements 4008-0/1, despite variations in a voltage at Vcommon, to establish an impedance of such elements 4008-0/1.

FIGS. 41A and 41B are graphs showing different operating conditions for an embodiment like that of FIG. 40, and equivalents.

FIGS. 41A and 41B both show a voltage (VSS) at a first power supply voltage node, a reference voltage VREF0 output from a reference circuit, an output voltage VADJ provided by a bias circuit, and a voltage at a common node (Vcommon). A common node voltage for FIG. 41B (Vcommon) may be greater than that for FIG. 41A (Vcommon). However, in both cases a voltage difference Vfix is maintained between Vcommon and VADJ.

In the particular operating conditions of FIGS. 41A/B, there is no scaling in the input fixed voltage and the output fixed voltage. That is, VREF0−VSS is substantially the same as Vcommon−VAJD (i.e., both are Vfix). However, alternate embodiments may introduce a scaling factor between the two voltage differences.

FIG. 42 shows another embodiment of a bias circuit 4200. Bias circuit 4200 may provide multiple output voltage VADJ0 to VAJD2, each of which may be "adjustable", providing a fixed voltage difference with respect to a voltage at a common node Vcommon.

In one very particular arrangement, a bias circuit 4200 may be one example of that shown in FIG. 39 and/or FIG. 40.

Bias circuit 4200 may include a reference circuit 4202, a first resistance R1, a current mirror circuit 4204, a second resistance R2, and switching circuits 4226-0 to 4226-2. A bias circuit 4200 may generate a reference voltage VREF, and in response, provide one of a multiple adjustable voltages VADJ0 to VADJ2 at output node 4206. Adjustable voltages VADJ0-2 may be applied to a programmable impedance element 4208 in different modes of operation.

A reference circuit 4202 may generate a reference voltage VREF. A difference between reference voltage VREF and supply voltage V0 may be a fixed voltage Vfix_in. A reference circuit 4202 may operate and include the same features as any of the reference circuits shown in the embodiments herein, or equivalents.

A first resistance R1 may receive a reference voltage VREF and a second voltage, in this particular example V0, to generate a first reference current IREF1.

A current mirror circuit 4204 may mirror first reference current IREF1 to generate a second, third and fourth reference currents IREF2-4. Such a mirroring may result in reference currents IREF2-4 tracking first reference current IREF1. In one embodiment, current mirroring will result in current IREF2 substantially matching current IREF1, with IREF2<IREF3<IREF4.

Second resistance R2 may have one terminal connected to a voltage V1 and have another terminal connected to different current sources of current mirror circuit 4204 by switches 4226-0 to 4226-2. When switch 4226-0 is enabled, a current IREF2 may be drawn through second resistance R2 to create a voltage drop of Vfix0 between V1 and output node 4206, which may be a first adjustable voltage VADJ0. When switch 4226-1 is enabled, a current IREF3 may be drawn through second resistance R2 to create a voltage drop of Vfix1 between V1 and output node 4206, which may be a second adjustable voltage VADJ1. When switch 4226-2 is enabled, a current IREF4 may be drawn through second resistance R2 to create a voltage drop of Vfix2 between V1 and output node 4206, which may be a third adjustable voltage VADJ2.

The various voltages VADJ0 to VADJ2 may be applied to terminals of a programmable impedance element 4208 depending upon a mode of operation. In the example of FIG. 42, a first access circuit 4228-0 may connect a voltage V1 or an output voltage VADJx (which may be any of VADJ0-2) to a first terminal 4230-0 of element 4208, while second access circuit 4228-1 may connect a voltage V1 or an output voltage VADJx to a second terminal 4230-1 of element 4208. As but a few very particular examples, in a read mode, first access circuit 4228-0 may connect a voltage V1 to a first terminal 4230-0, while a second access circuit 4228-1 may connect a voltage VADJ0 to a second terminal 4230-1. In a first type write operation (e.g., program) first access circuit 4228-0 may connect a voltage V1 to a first terminal 4230-0, while second access circuit 4228-1 may connect a voltage VADJ1 to a second terminal 4230-1. In a second type write operation (e.g., erase) first access circuit 4228-0 may connect a voltage VADJ2 to a first terminal 4230-0, while second access circuit 4228-1 may connect a voltage V1 to a second terminal 4230-1.

FIG. 43 shows another embodiment of a bias circuit 4300. Bias circuit 4300 may also provide multiple output voltage VADJ0 to VAJD2, each of which may be "adjustable".

In one very particular arrangement, a bias circuit 4300 may be one example of that shown in FIG. 39 and/or FIG. 40.

Bias circuit 4300 may include a reference circuit 4302, a first resistance R1, a current mirror circuit 4304, a second resistance R2, third resistance R3, and fourth resistance R4. A bias circuit 4300 may generate a reference voltage VREF, and in response, provide multiple adjustable voltages VADJ0 to VADJ2 at output nodes 4306-0 to 4306-2, respectively. Adjustable voltages VADJ0-2 may be applied to a programmable impedance element 4308 in different modes of operation.

A reference circuit 4302 may generate a reference voltage VREF. A difference between reference voltage VREF and supply voltage V0 may be a fixed voltage Vfix_in. A reference circuit 4302 may operate and include the same features as any of the reference circuits shown in the embodiments herein, or equivalents.

A first resistance R1 may receive a reference voltage VREF and a second voltage, in this particular example V0, to generate a first reference current IREF1.

A current mirror circuit 4304 may mirror first reference current IREF1 to generate a second, third and fourth reference currents IREF2-4. Such a mirroring may result in reference currents IREF2-4 tracking first reference current IREF1. In one embodiment, current mirroring will result in one and/or all of currents IREF2 to IREF4 substantially matching current IREF1. However, in other embodiments, any or all of currents IREF2 to IREF4 may be scaled with respect to IREF1.

Second, third and fourth resistances R2-R4 may each have one terminal connected to a voltage V1, and have other terminals connected to different output nodes 4306-0 to 4306-2, respectively. Current IREF2 may be drawn through second resistance R2, current IREF3 may be drawn through third resistance R3, and current IREF3 may be drawn through fourth resistance R4. This may create voltage differences between voltage V1 and output nodes 4306-0 to 4306-2. In the embodiment shown, a difference between reference voltage V1 and voltage VADJ0 may be fixed voltage Vfix0, a difference between reference voltage V1 and voltage VADJ1 may be fixed voltage Vfix1, a difference between reference voltage V1 and voltage VADJ2 may be fixed voltage Vfix2.

It is understood that values Vfix0 to Vfix2 may be scaled or not scaled with respect to Vfix_in generated by reference circuit 4302. In the former case, scaling may be accomplished by device sizing within current mirror circuit 4304 to scale any of IREF2 to IREF4 with respect to IREF1, or may be accomplished by scaling any of resistances R2 to R4 with respect to resistance R1, or some combination thereof.

The various voltages VADJ0 to VADJ2 may be applied to terminals of a programmable impedance element 4308 depending upon a mode of operation. In the example of FIG. 43, a second access circuit 4328-1 may connect a voltage V1, voltage VADJ0, or voltage VADJ1 to a second terminal 4330-1 of element 4308, while a first access circuit 4328-0 may connect a voltage V1 or a voltage VADJ2 to a first terminal 4330-1 of element 4308. As but a few very particular examples, in a read mode, second access circuit 4328-1 may connect a voltage VADJ0 to a second terminal 4330-1, while first access circuit 4328-0 may connect a voltage V1 to a first terminal 4330-0. In a first type write operation (e.g., program) second access circuit 4328-1 may connect a voltage VADJ1 to a second terminal 4330-1, while first access circuit 4328-0 may connect a voltage V1 t a first terminal 4330-0. In a second type write operation (e.g., erase) second access circuit 4328-1 may connect a voltage V1 to a second terminal 4330-0, while first access circuit 4328-0 may connect a voltage VADJ2 to a first terminal 4330-0.

Figure 44A:
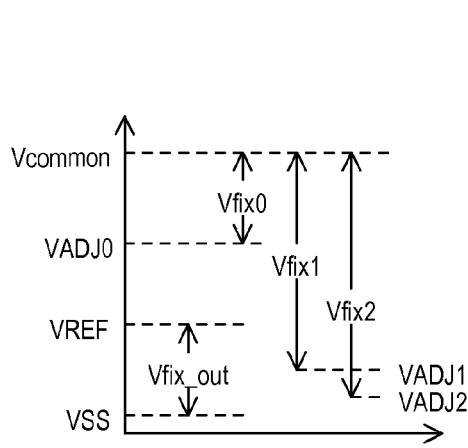
FIGS. 44A and 44B are graphs showing different operating conditions of a bias circuit according to additional embodiments.
Figure 44B:
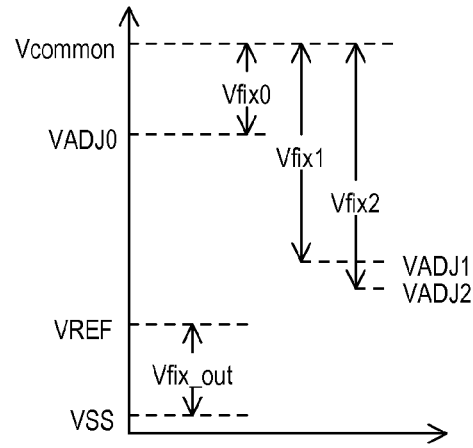

FIGS. 44A and 44B are graphs showing particular operating conditions for particular configurations of circuits like that of FIG. 42 and/or 43 and equivalents.

FIGS. 44A and 44B both show a voltage at a first power supply voltage node (VSS), a reference voltage VREF output from a reference circuit, output voltages VADJ0 to VADJ2 provided by a bias circuit, and a voltage at a common node (Vcommon). However, a common node voltage for FIG. 44B (Vcommon) may be greater than that for FIG. 44A (Vcommon). However, in both cases voltage differences Vfix0 to Vfix2 are maintained between Vcommon and corresponding voltages VADJ0 to VADJ2.

In the particular operating conditions of FIGS. 44A/B, there is no scaling in the input fixed voltage (Vfix_in) and fixed output difference Vfix0. However, the other fixed output differences Vfix1 and Vfix2 are scaled to be larger with respect to Vfix_in.

Figure 45A:
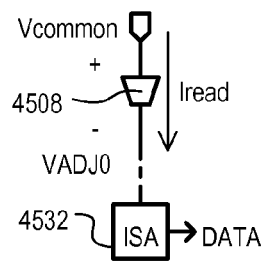
FIGS. 45A to 45C show read, program and erase operations according to various embodiments.
Figure 45B:
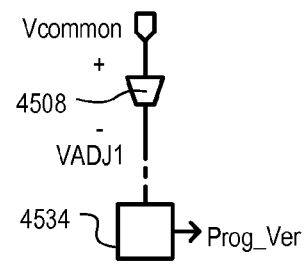
Figure 45C:
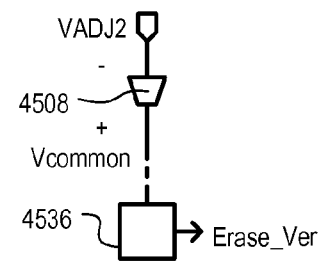

FIG. 45A to 45C show examples of operations that may be performed according to the various embodiments shown herein, or equivalents. In the examples of FIGS. 45A to 45C, various operations may be performed on a programmable impedance element 4508. A programmable impedance element 4508 may have a dynamic read response, or a static read response as described in embodiments above.

FIG. 45A shows one example of a read operation according to one particular embodiment. A first terminal element 4508 may be connected, directly or indirectly, to a voltage at node Vcommon. A second terminal of element 4508 may be connected, directly indirectly, to a voltage VADJ0. A difference between Vcommon and VADJ0 may be Vfix0, regardless of changes in Vcommon. In response to such a bias, a read current Iread may flow through element 4508. A read current Iread may be detected by a current sense amplifier 4532 connected, directly or indirectly, to a cathode of element 4508. Based on current Iread, current sense amplifier 4532 may generate a DATA value. In some embodiments, a current sense amplifier 4532 may sense a dynamic change in current through an element 4508.

FIG. 45B shows one example of a program operation according to one particular embodiment. A first terminal of element 4508 may be connected, directly or indirectly, to a voltage at node Vcommon. A second terminal of element 4508 may be connected, directly indirectly, to a voltage VADJ1. A difference between Vcommon and VADJ1 may be Vfix1, regardless of changes in Vcommon. In response to such a bias, an element 4508 may be placed into a first programmed state. In some embodiments, such an operation may reduce a time-to-change property (i.e., the time required for an element to change properties under read conditions). In other embodiments, application of Vfix1 may cause element 4508 to change to a relatively low impedance. A sense circuit 4534 may be connected, directly or indirectly, to a second terminal of element 4508. A sense circuit 4534 may detect when a property of element 4508 has been achieved (e.g., impedance, current flow etc.), and activate a signal Prog_Ver in response.

FIG. 45C shows one example of an erase operation according to one particular embodiment. A second terminal of element 4508 may be connected, directly or indirectly, to a voltage Vcommon. A first terminal of element 4508 may be connected, directly indirectly, to a voltage VADJ2. A difference between VADJ2 and Vcommon may be Vfix2, regardless of changes in Vcommon. In response to such a bias, an element 4508 may be placed into a second programmed state. In some embodiments, such an operation may increase a time-to-change property. In other embodiments, application of Vfix1 may cause element 4508 to change to a relatively high impedance. A sense circuit 4536 may be connected, directly or indirectly, to a cathode of element 4508. A sense circuit 4534 may detect when a property of element 4508 has been achieved (e.g., impedance, current flow etc.), and activate a signal Erase_Ver in response.

Figure 46:
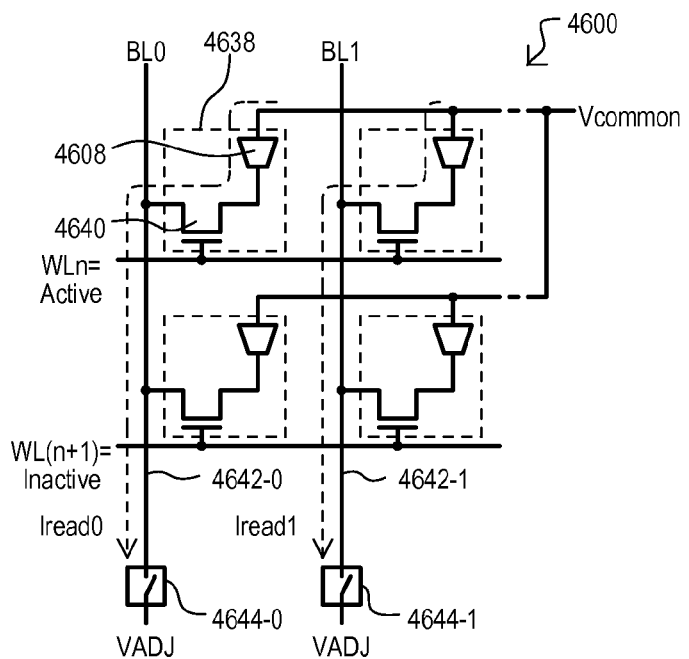
FIG. 46 is a block schematic diagram of a memory device according to an embodiment.

FIG. 46 shows one example of memory device 4600 according to an embodiment. A memory device 4600 may include a number of memory cells (one shown as 4638) arranged into rows and columns. Memory cells (e.g., 4638) may each include an access device (one shown as 4640) and a programmable impedance element (one shown as 4608). In the particular embodiment of FIG. 46, memory cells (e.g., 4638) may each include an n-channel transistor as an access device. Access devices of memory cells in the same row may be enabled by a corresponding word line (WLn, WL(n+1)). When enabled, each access device may connect its programmable impedance element to a bit line 4642-0/1 of a corresponding column.

First terminals of programmable impedance elements (e.g., 4608) may be connected to a node Vcommon. Bit lines 4642-0/1 may each be connected to a voltage VADJ by corresponding switch circuits 4644-0/1. A voltage VADJ may be an adjustable voltage generated according to the embodiments herein, or equivalents. A voltage VADJ may be fixed with respect to Vcommon.

In a predetermined operation, such as a read operation as but one example, a voltage may be applied at Vcommon, and an adjustable voltage (ADJ) having a fixed offset with respect to Vcommon may be applied to bit lines 4642-0/1 via switch circuits 4644-0/1. As a result, a read current Iread0 may flow through bit line 4642-0 and a read current Iread1 may flow through bit line 4642-1. Read currents Iread0/1 may be dynamic in the event a corresponding programmable impedance element has a dynamic response during a read operation, or may be static in the event such elements have a static response (e.g., are PMCs).

Figure 47:
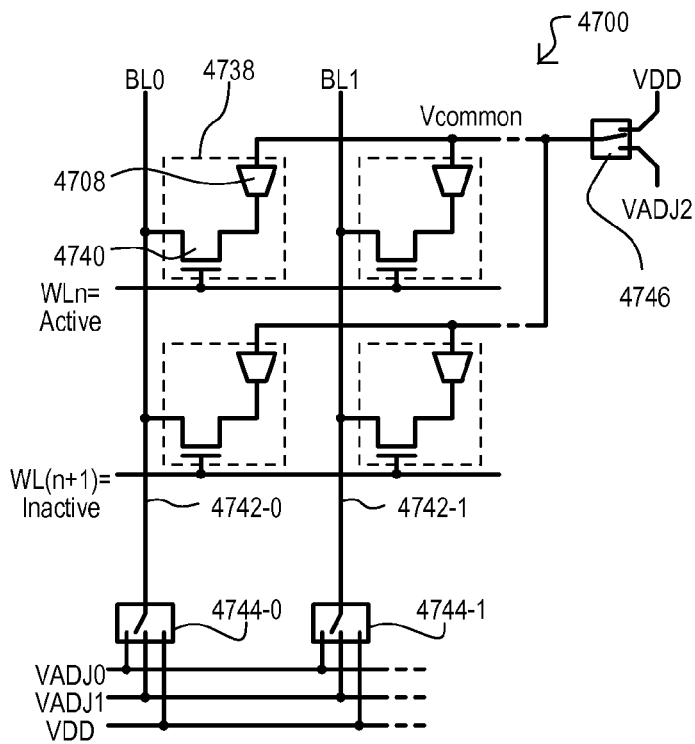
FIG. 47 is a block schematic diagram of a memory device according to a further embodiment.

FIG. 47 shows another example of memory device 4700 according to another embodiment. A memory device 4700 may include some of the same features as that shown in FIG. 46, thus like features are referred by the same reference character but with the first two digits being a "47" instead of "46".

Memory device 4700 may differ from that of FIG. 46 in that it may include a common node switch 4746 that may connect either a high power supply voltage VDD or an adjustable voltage VADJ2 to a common node Vcommon. In addition, switch circuits 4744-0/1 may connect adjustable voltages VADJ0, VADJ1, or power supply voltage VDD to corresponding bit lines 4742-0/1.

In one predetermined operation, such as a read operation, a voltage VDD may be applied at Vcommon, and an adjustable voltage (VADJ0) having a first fixed offset with respect to VDD may be applied to bit lines 4742-0/1 via switch circuits 4744-0/1. In another predetermined operation, such as a program operation, a voltage VDD may be applied at Vcommon, and an adjustable voltage (VADJ1) having a second fixed offset with respect to VDD may be selectively applied to bit lines 4742-0/1 via switch circuits 4744-0/1. Optionally, in a third predetermined operation, such as an erase operation, a voltage VADJ2 may be applied at Vcommon, and a power supply voltage VDD may be selectively applied to bit lines 4742-0/1 via switch circuits 4744-0/1.

Figure 48:
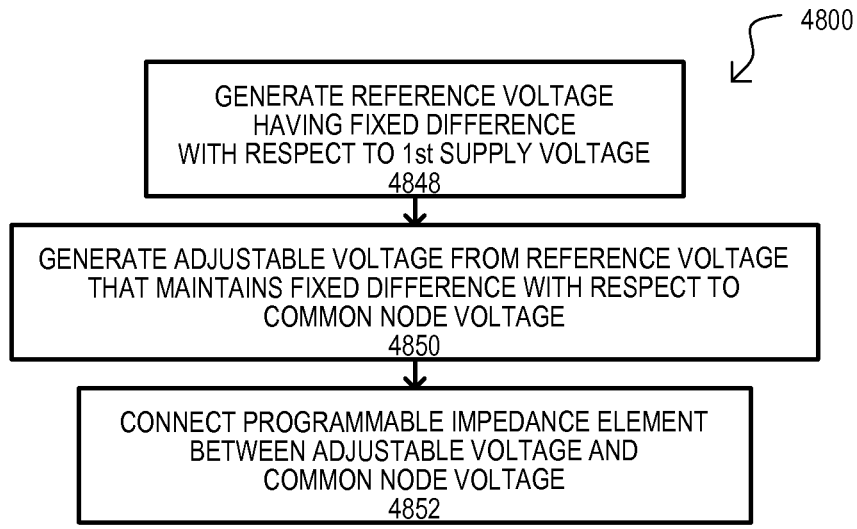
FIG. 48 is a flow diagram of a bias voltage generation method according to an embodiment.

FIG. 48 shows a method 4800 according to an embodiment. A method 4800 may include generating a reference voltage having a fixed difference with respect to a first power supply voltage (4848). Such an action may generate a fixed voltage value from which other values may be generated.

A method 4800 may also include generating an adjustable voltage from the reference voltage that maintains a fixed difference with respect to a common node voltage (4850). In such an arrangement, even though a common node voltage may vary, an adjustable voltage may maintain a fixed difference with the common mode voltage.

A method 4800 may then connect a programmable impedance element between the adjustable voltage and the common node voltage (4852). Such an action may apply a known voltage across the programmable impedance element to execute a predetermined operation, including but not limited to a read operation and/or a write operation. The known voltage may remain the same regardless of changes in the common node voltage.

Figure 49:
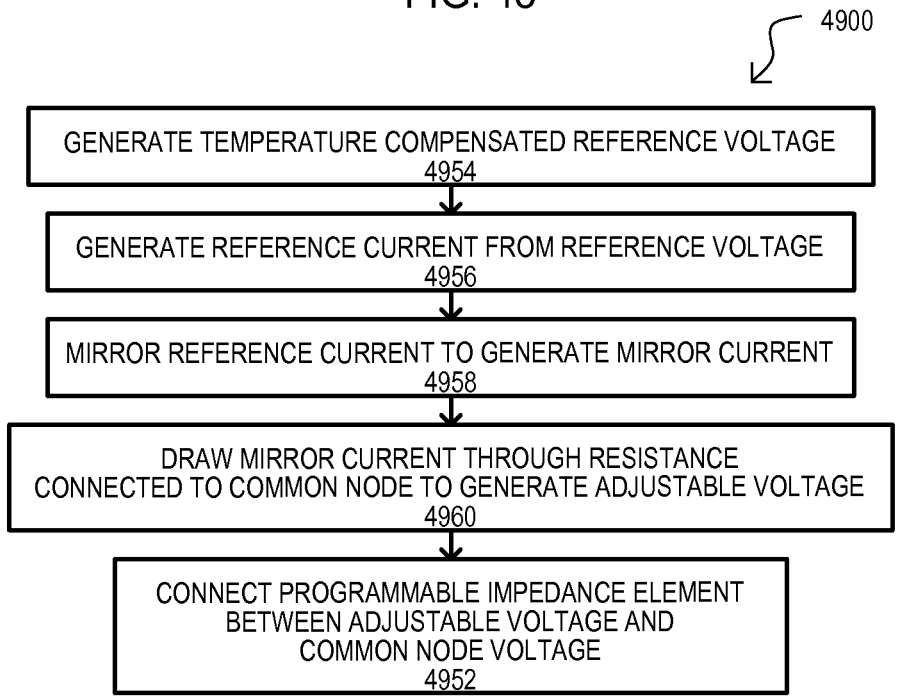
FIG. 49 is a flow diagram of a bias voltage generation method according to another embodiment.

FIG. 49 shows a method 4900 according to a further embodiment. Method 4900 may include generating a temperature compensated reference voltage (4954). Such an action may include generating a reference voltage that does not substantially vary in response to changes in operating temperature. In one embodiment, such an operation may include offsetting a proportional to absolute temperature value with a complementary to absolute temperature value. In a very particular embodiment, such an action may utilize a band-gap reference voltage circuit.

A method 4900 may also include generating a reference current from the reference voltage (4956). In a particular embodiment, such an action may generate a reference current proportional to the reference voltage, and that is substantially temperature independent. Such an action may include applying a reference voltage to a resistance to generate the reference current.

A method 4900 may further include mirroring the reference current to generate a mirror current (4958). Such an action may include generating a mirror current that tracks a reference current. In one particular embodiment, such an action may utilize a current mirror with a reference current as an input current and a mirror current as an output current. A mirror current may match, or may be a scaled with respect to a reference current.

A method 4900 may draw the mirror current through a resistance connected to a common node to generate an adjustable voltage (4960). Such an action may generate an adjustable voltage having a fixed voltage difference with respect to the common node voltage.

A method 4900 may then connect a programmable impedance element between the adjustable voltage and the common node voltage (4952). Such an action may apply a known voltage across the programmable impedance element to execute a predetermined operation, including but not limited to a read operation and/or a write operation.

While embodiments shown in above include circuits that program impedance elements into two states, other embodiments may program elements into more than two states, such state representing different dynamic and/or static responses in a read operation.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An integrated circuit (IC) device, comprising:
    a plurality of memory cells, each including at least one element programmable between different impedance states by application of a voltage or current;
    a plurality of bit line groups, each bit line group including multiple bit lines, each bit line being coupled to multiple memory cells;
    a plurality of current source circuits coupled to the bit line groups, each current source circuit configured to couple the bit lines of its respective group to at least a first bias node or a second bias node;
    a controller circuit configured to generate current source control signals in response to input mode data; and
    the two current source circuits are configured to couple corresponding bit line groups to at least the first or second bias nodes in response to the current control signals.

2. The IC device of claim 1, wherein:
    the bit line groups include a first group that includes even bit lines and a second group that includes odd bit lines, the even bit lines alternating with the odd bit lines, and the even and odd bit lines being substantially parallel to one another; wherein
    the even and odd bit lines include at least sixteen bit lines.

3. The IC device of claim 1, wherein:
    the memory cells are arranged into an array of rows and columns, the memory cells of a same column being coupled to the same bit line, the memory cells of the same row being coupled to a same word line.

4. The IC device of claim 3, wherein:
    each memory cell includes at least one access device configured to couple the element of the memory cell to the corresponding bit line in response to a signal on its corresponding word line.

5. The IC device of claim 1, wherein:
    the elements comprise conductive bridging random access memory (CBRAM) elements.

6. The IC device of claim 1, wherein:
    each current source circuit is further configured to couple its respective bit line group to a high impedance node.

7. The IC device of claim 1, wherein:
    the first bias node is configured to receive a high power supply voltage; and
    the second bias node is configured to receive a low power supply voltage.

8. The IC device of claim 1, further including:
    the memory cells are arranged into an array of rows and columns, the memory cells of a same column being coupled to the same bit line, the memory cells of the same row being coupled to a same word line;
    a row control circuit configured to access rows of memory cells in response to row control signals; and
    the controller circuit further includes a row counter configured to generate a sequence of row control signals based on a row value generated in response to the row counter.

9. The IC device of claim 1, further including:
    the memory cells are arranged into an array of rows and columns, the memory cells of a same column being coupled to the same bit line, the memory cells of the same row being coupled to a same word line, each word line being activated in response to a row control signal; and
    the controller circuit is configured to automatically write data into a sequence of rows and further includes a row counter that generates a sequence of row control signals in response to the row counter.

10. A method, comprising
    coupling a first bit line group to one of a plurality of different bias nodes in response to a first control signal;
    coupling a second bit line group to one of the different bias nodes in response to a second control signal; and
    the first and second bit lines groups each include a plurality of bit lines, each bit line is coupled to a column of memory cells, and each memory cell includes at least one element programmable between at least two different impedance states; wherein,
    the bias nodes include a first bias node configured to receive a first potential; and
    coupling the first bit line group to the first bias node writes a first data value into memory cells coupled to the first bit line group.

11. The method of claim 10, wherein:
    the bias nodes include a second bias node configured to receive a second potential; and
    coupling the second bit line group to the second bias node writes a second data value into memory cells coupled to the second bit line group.

12. The method of claim 10, further including:
    the memory cells are further arranged into rows;
    for a first group of rows, coupling the first bit line group to a first of the bias nodes, and coupling the second bit line group to a second of the bias nodes; and
    for a second group of rows, coupling the first bit line group to the second of the bias nodes, and coupling the second bit line group to the first of the bias nodes; wherein
    the first bias node is biased to a first potential that writes a first data value into the memory cells, and the second bias node is biased to a second potential that writes a second data value into the memory cells.

13. The method of claim 12, wherein:
    the bit lines of the first bit line group alternate with the bit lines of the second bit line group in a row direction of a memory array;
    the rows of the first group of rows alternate with the rows of the second group of rows in a column direction of the memory array; and
    the method writes a checkerboard pattern into the array.

14. The method of claim 10, wherein:
    the bias nodes include a first bias node configured to receive a first potential;
    coupling the first bit line group to the first bias node;
    coupling the second bit line group to the first bias node; and determining if a current through the bit lines is below a predetermined threshold to detect bit line related defects.

15. The method of claim 10, wherein:
the bias nodes include a first bias node configured to receive a first potential and a high impedance bias node;
coupling the first bit line group to the first bias node;
coupling the second bit line group to the high impedance node; and
determining if a current through a bit line of the second bit line group is above a predetermined threshold to detect bit line related defects.

16. An integrated circuit (IC) device, comprising:
at least one memory cell array including memory cells arranged into rows and columns, memory cells of the same column being coupled to a same bit line, and each memory cell including at least one element programmable between different impedance states;
current source circuits disposed on one side of the memory cell array, each current source circuit configured to independently connect a different group of bit lines to one of a plurality of different bias nodes; and
column sensing circuits disposed on a side of the memory cell array opposite to the current source circuits, the column sensing circuits configured to sense currents flowing through the bit lines.

17. The IC device of claim 16, wherein:
the bias nodes include
a first bias node configured to receive a first potential, and
a second bias node configured to receive a second potential that is lower than the first potential.

18. The IC device of claim 16, further including:
the column sensing circuits to generate data values in response to the sense currents; and
a memory controller configured to control which bias voltages are applied to the bias node and including a test latch configured to store the data values from the columns sense circuit.

19. The IC device of claim 16, further including:
a memory controller that includes
a row counter configured to generate row access values to access rows of memory cells according to a predetermined sequence; and
a column counter configured to generate column access values to access columns of memory cells according to a predetermined sequence.

* * * * *